United States Patent [19]
Tsuji et al.

[11] Patent Number: 5,836,226
[45] Date of Patent: Nov. 17, 1998

[54] APPARATUS FOR PROGRESSIVELY FEEDING AND MACHINING SHEET MATERIAL

[75] Inventors: Hiroyuki Tsuji, Nagoya; Kazumasa Kitamura, Ichinomiya; Motoo Noritake, Nagoya, all of Japan

[73] Assignee: NGK Insulators, Ltd., Japan

[21] Appl. No.: 772,119

[22] Filed: Dec. 20, 1996

[30] Foreign Application Priority Data

Dec. 25, 1995 [JP] Japan ................... 7-337425
Dec. 18, 1996 [JP] Japan ................... 8-338796
Dec. 18, 1996 [JP] Japan ................... 8-338800

[51] Int. Cl.$^6$ ................................................. B26D 7/06
[52] U.S. Cl. .......................... 83/129; 83/177; 83/276; 83/386; 83/451; 83/556
[58] Field of Search ............................. 83/86, 100, 111, 83/129, 133, 136, 142, 143, 169, 177, 276, 386, 371, 451, 453, 556, 558, 562, 563, 687, 821, 824

[56] References Cited

U.S. PATENT DOCUMENTS

| | | | |
|---|---|---|---|
| 1,351,264 | 8/1920 | Schumacher | 83/100 |
| 3,014,412 | 12/1961 | Barcia et al. | 83/86 |
| 3,500,710 | 3/1970 | Taber | 83/588 |
| 3,733,944 | 5/1973 | Dietrick et al. | 83/129 |
| 3,735,654 | 5/1973 | Jurasek | 83/100 |
| 3,863,534 | 2/1975 | Scott | 83/100 |
| 3,884,061 | 5/1975 | Westby | 83/276 |
| 4,425,829 | 1/1984 | Kranik et al. | 83/100 |
| 4,494,433 | 1/1985 | Gerber | 83/100 |
| 5,096,108 | 3/1992 | Kuze | 83/451 |
| 5,193,426 | 3/1993 | Dunn | 83/277 |
| 5,303,618 | 4/1994 | Norell | 76/107 |
| 5,382,404 | 1/1995 | Kogame | 83/100 |
| 5,414,617 | 5/1995 | Pomerleau et al. | 83/451 |

FOREIGN PATENT DOCUMENTS

| | | | |
|---|---|---|---|
| 162290 | 11/1985 | European Pat. Off. | 83/100 |
| 329 172 | 8/1989 | European Pat. Off. | |
| 1007418 | 10/1965 | United Kingdom. | |

OTHER PUBLICATIONS

IBM Technical Disclosure Bulletin, vol. 24, No. 11b, Apr. 1982, New York, pp. 6017–6019, XP002027914 "Process for Testing the Operation of an Indexable Via Punching Apparatus".

IBM Technical Disclosure Bulletin, vol. 16, No. 12, May 1974, New York, p. 3921 XP002027913 "Programmable Cluster Punching System".

IBM Technical Disclosure Bulletin, vol. 32, No. 7, Dec. 1989, New York, pp. 255–257, XP002027941 "Via Punching Device for Multi–Layered Ceramic Substrates".

IBM Technical Disclosure Bulletin, vol. 15, No. 2, Jul. 1972, New York, pp. 408–409, XP002027942 "Progressive Gang Punch".

IBM Technical Disclosure Bulletin, vol. 28, No. 12, Jun. 1986, New York, pp. 5265–5266, XP002027943 "Apparatus for Precise Separation of Printed Wiring Boards from a Panel".

*Primary Examiner*—Maurina T. Rachuba
*Attorney, Agent, or Firm*—Parkhurst & Wendel, L.L.P.

[57] ABSTRACT

A progressively feeding and machining apparatus has a die for placing a sheet material thereon, the die having a machining pattern for machining the sheet material, an upper punch base or a machining head movable toward and away from the die and having a plurality of punches for machining the sheet material in coaction with the die in a predetermined number of machining cycles according to the machining pattern, a feed mechanism for moving the die, with the sheet material placed thereon, and the punches relatively to each other to align a machining position on the sheet material with the punches each time the sheet material is machined by the die and the punches, a suction chamber communicating with the machining pattern, and a closure mechanism for isolating a machined region of the machining pattern from the suction chamber to maintain the suction chamber under a vacuum when the suction chamber is evacuated. The progressively feeding and machining apparatus is capable of machining various sheet materials highly accurately and efficiently, and is relatively simple in structure.

21 Claims, 26 Drawing Sheets

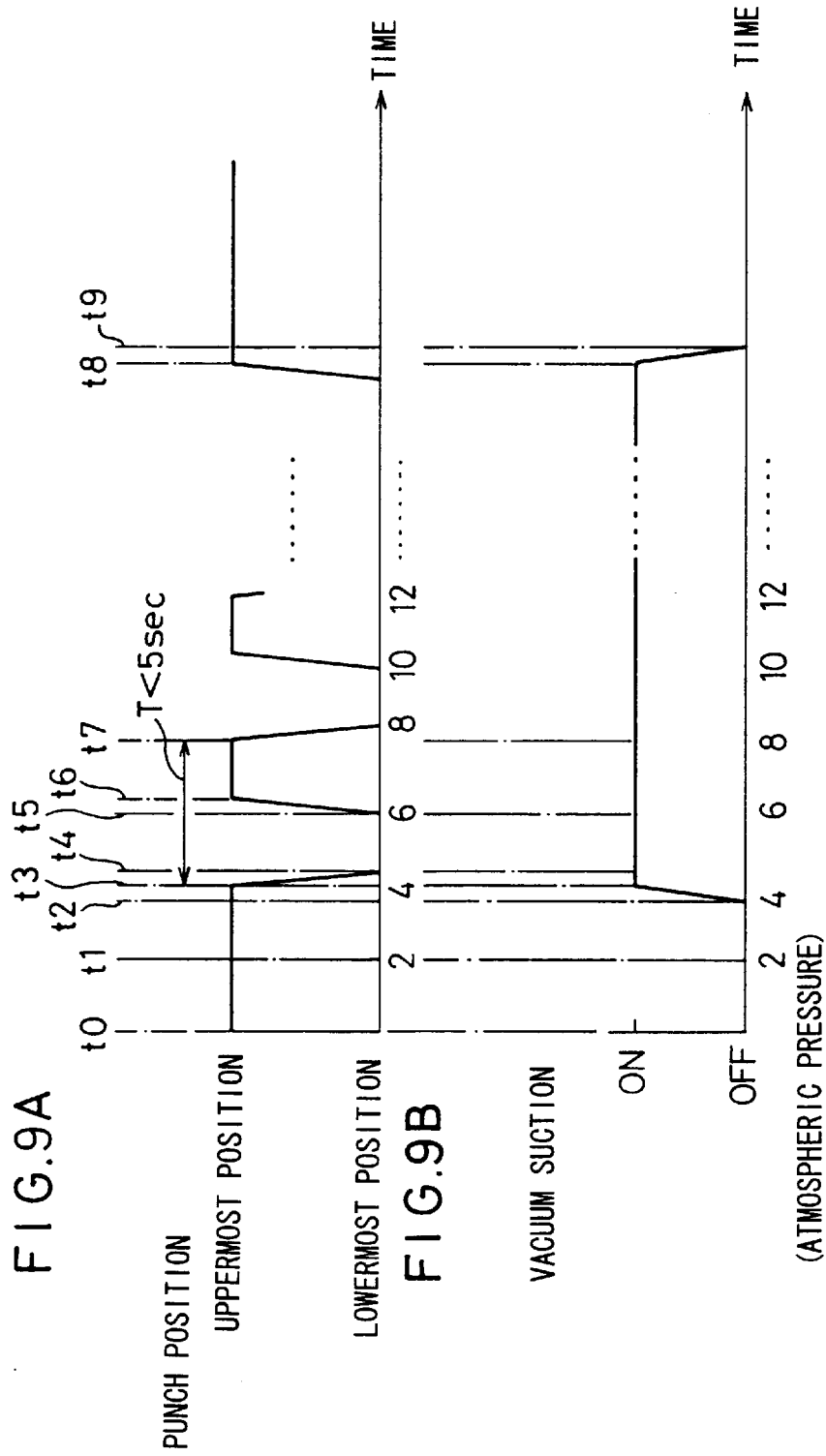

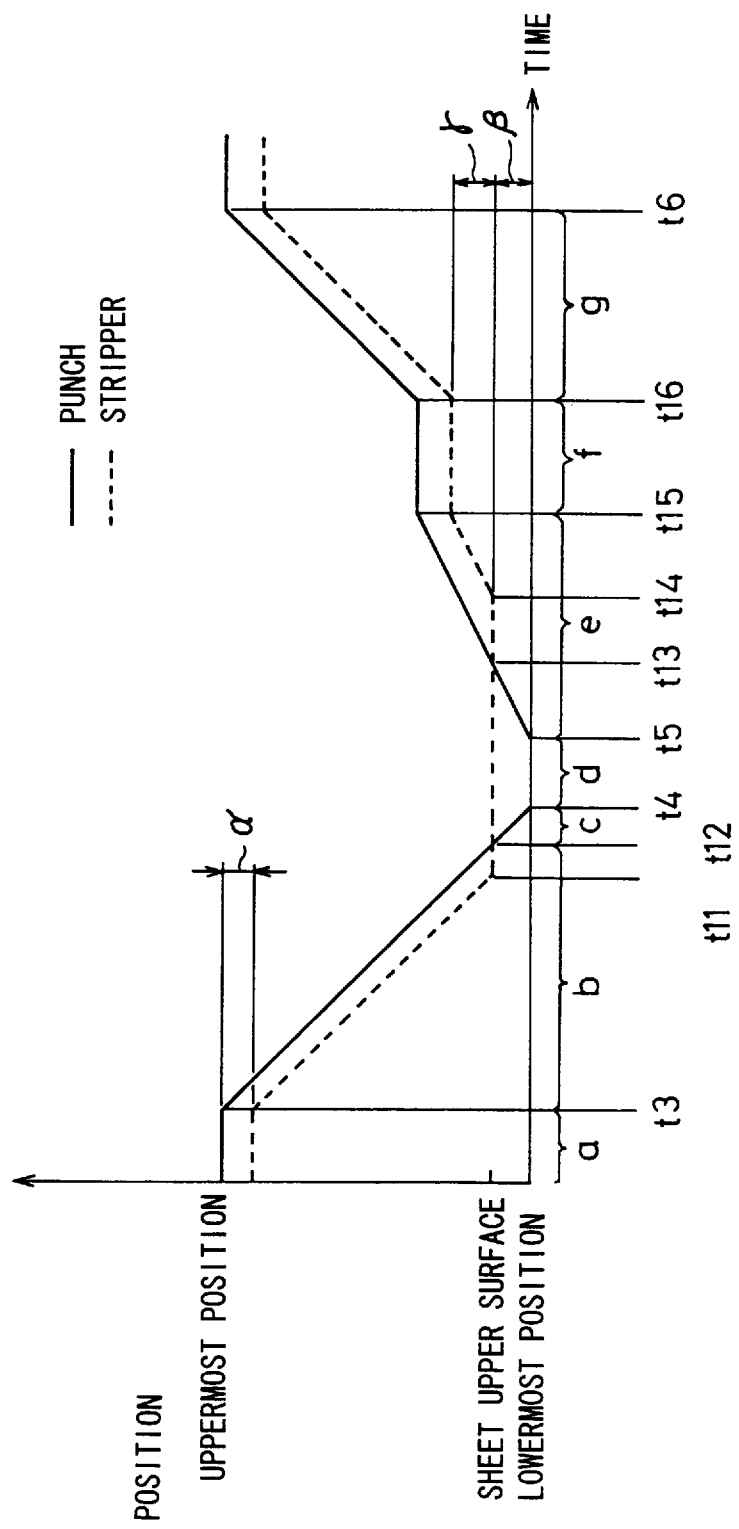

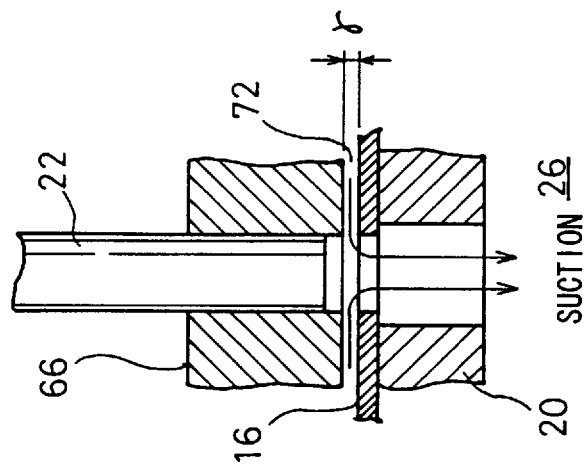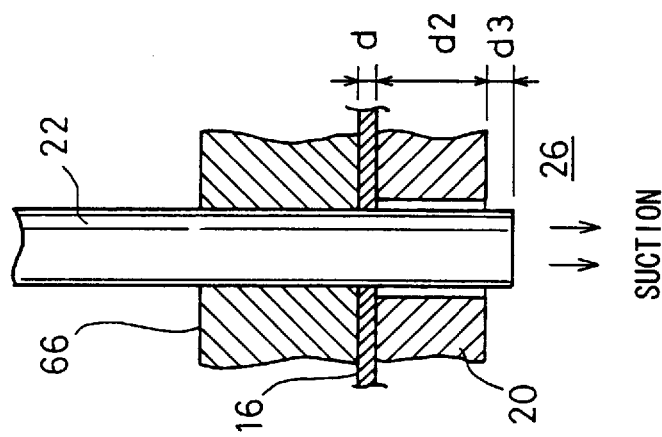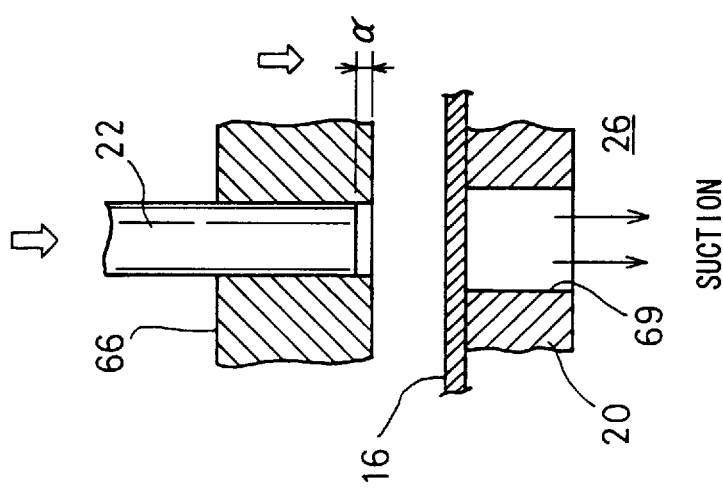

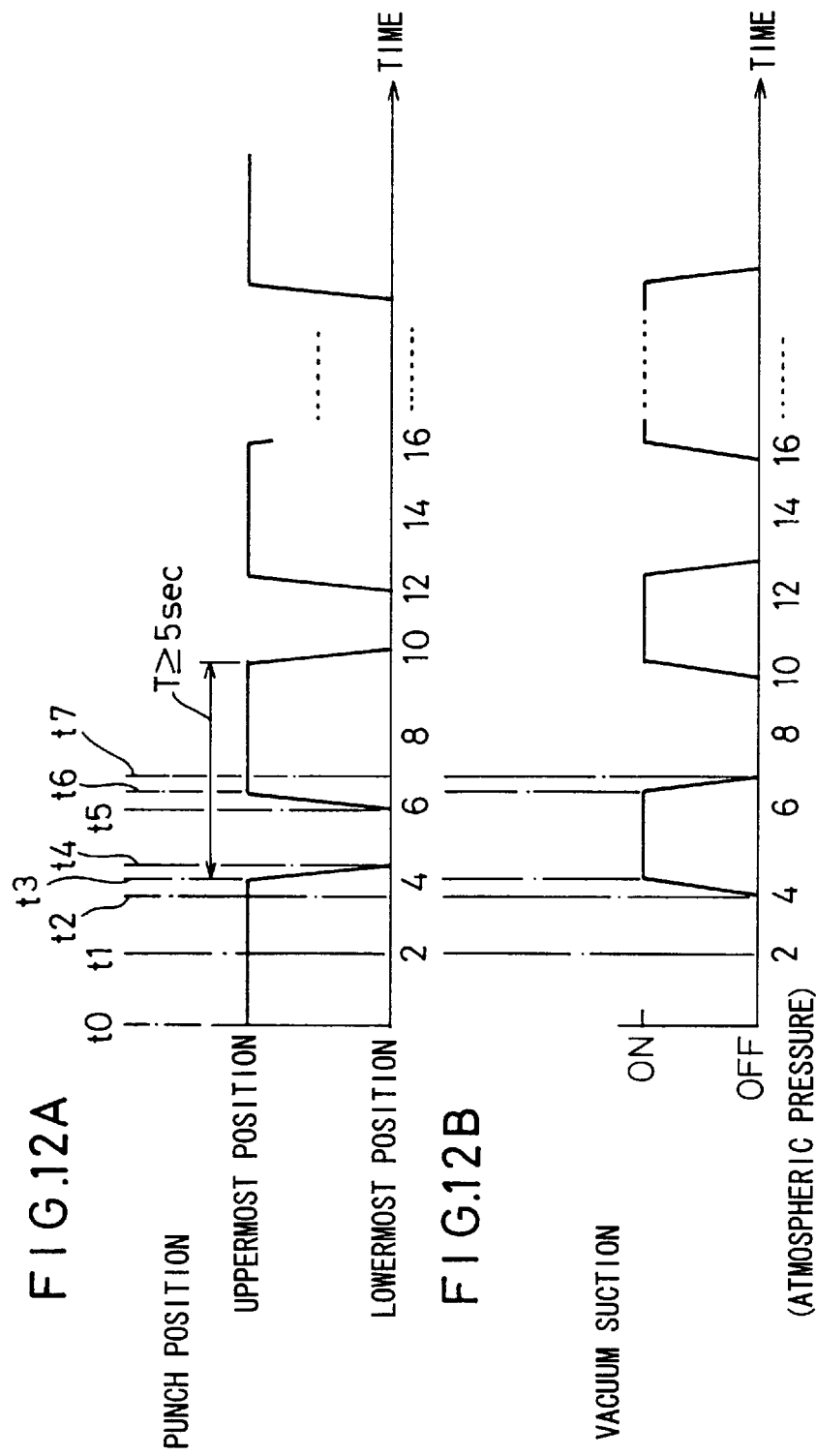

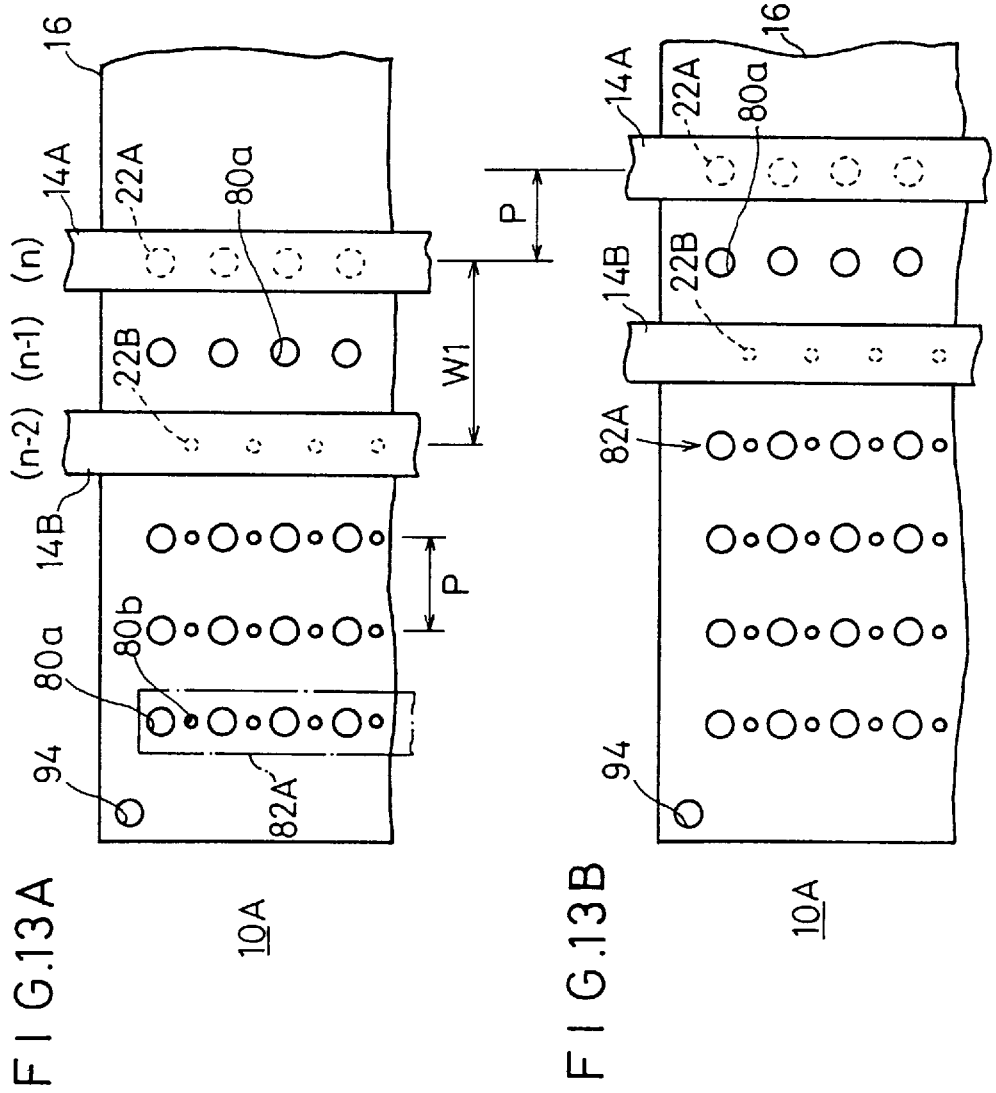

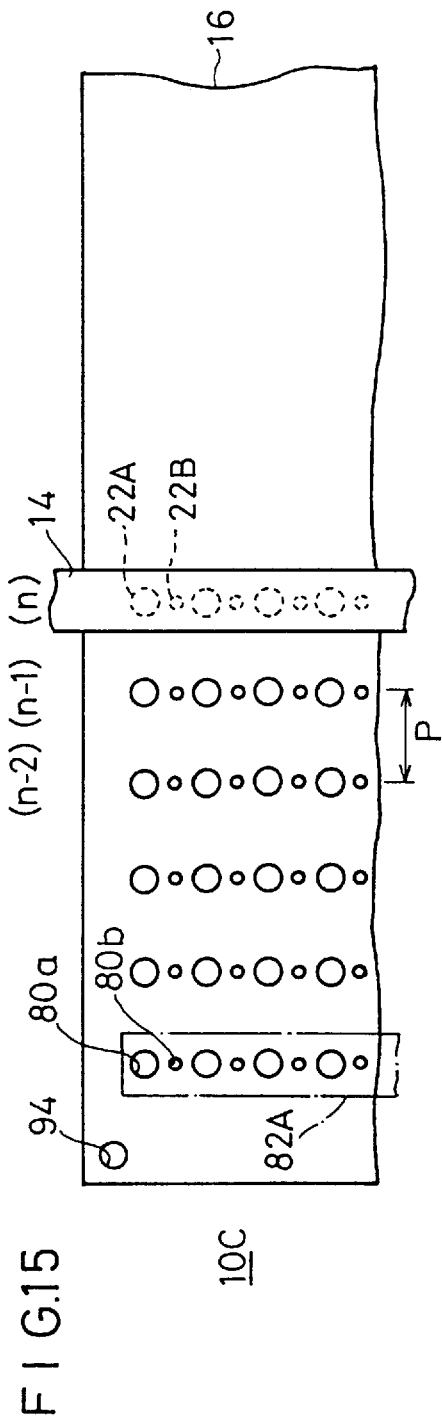

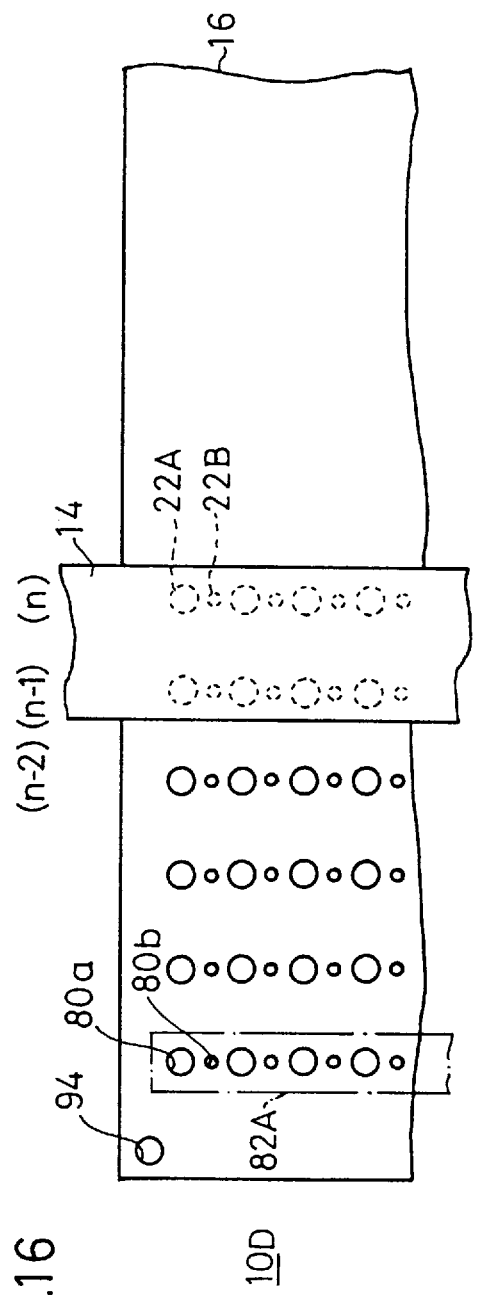

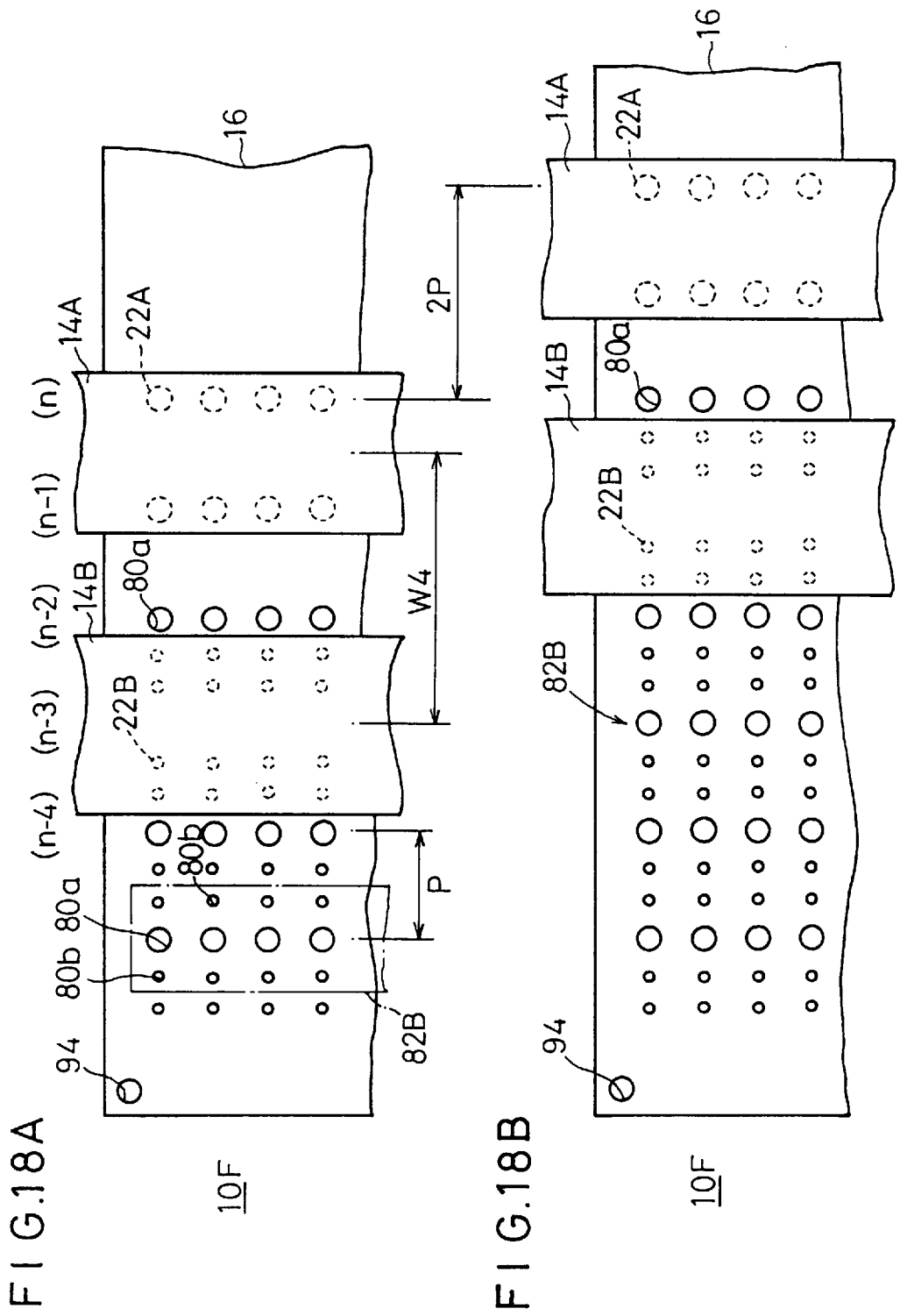

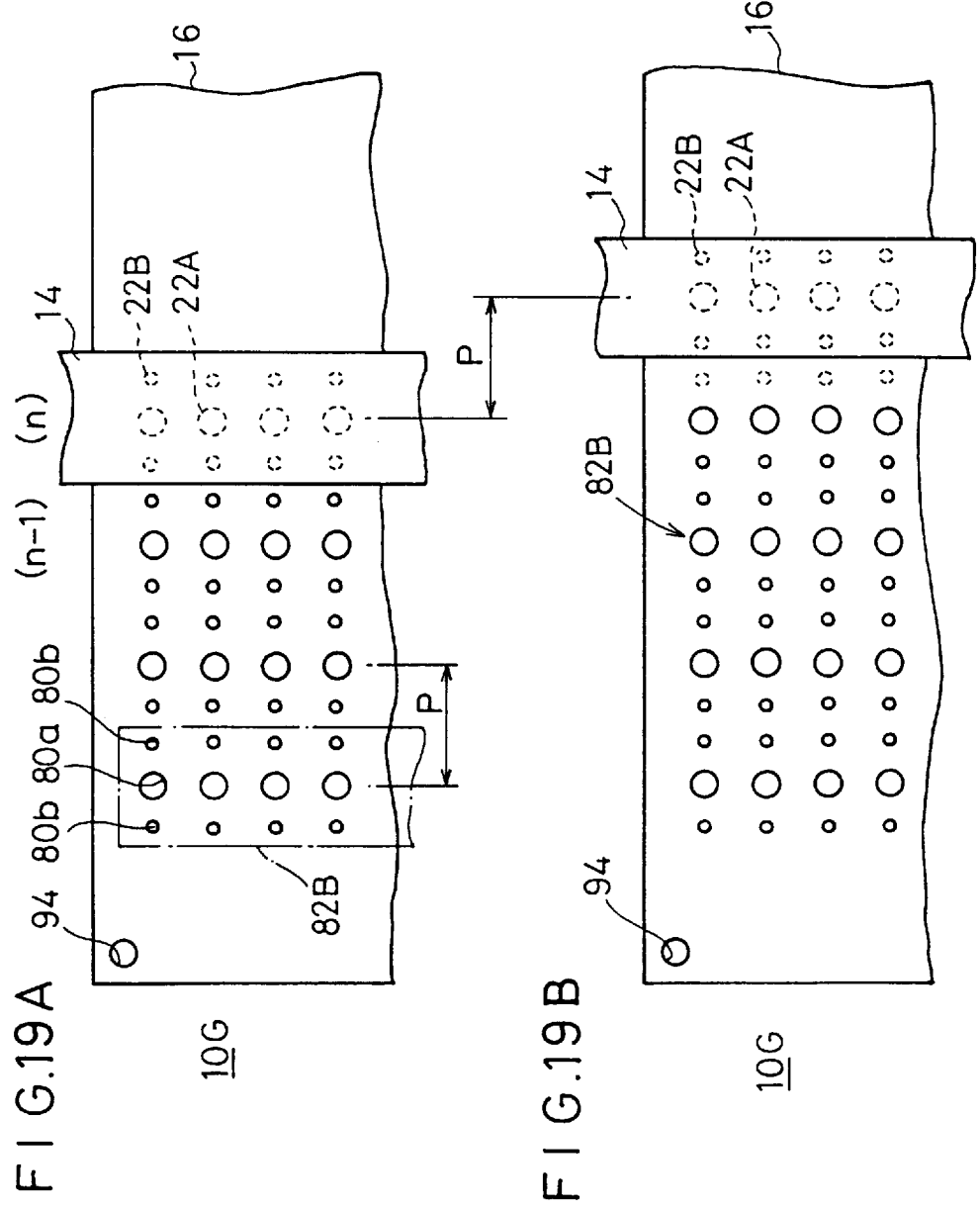

F I G. 24
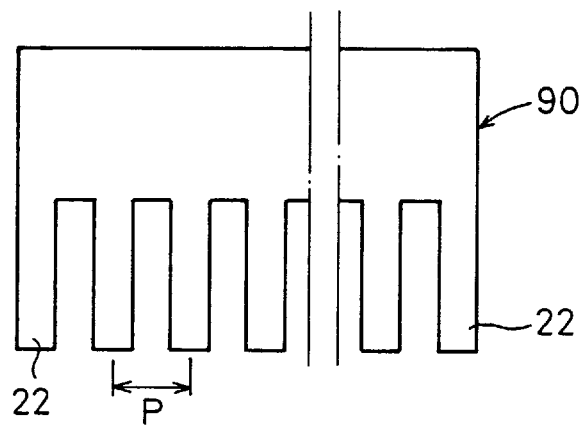
F I G. 25
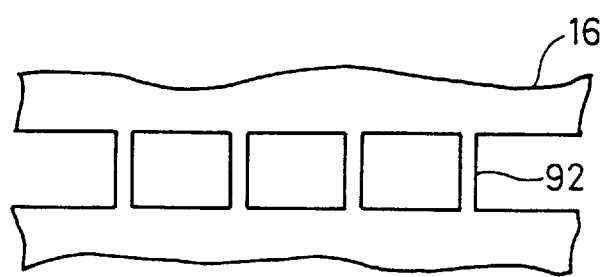

APPARATUS FOR PROGRESSIVELY FEEDING AND MACHINING SHEET MATERIAL

BACKGROUND OF THE INVENTION

1. Field of the Invention

The present invention relates to an apparatus for progressively feeding and machining a sheet material with a die and punches, and more particularly to an apparatus for progressively feeding and machining a sheet material which has a low Young's modulus and is easily deformable under other external forces than forces applied to punch the sheet material.

2. Description of the Related Art

Various dies or machining apparatus have generally been used to punch holes or openings in workpieces. For example, there are known a progressive die assembly having dies and punches movable toward and away from each other for successively punching holes in a workpiece that is being fed through the dies and punches, and a compound blank-and-pierce die assembly for blanking and punching a workpiece at once with a die which has holes according to a machining pattern for the workpiece and as many punches as the number of those holes in the die.

In the progressive die assembly, since only the workpiece is moved, external forces are applied to move the workpiece. The workpiece is normally spaced from the dies so that it can be fed successively through the dies and punches. Therefore, the workpiece is subject to external forces when it is punched by the punches.

If the workpiece comprises a thin adhesive sheet or a soft green sheet to be fired into a sintered product, then the sheet tends to be strained by the external forces applied to move the sheet and also the external forces applied to punch the sheet. When the sheet is strained, it reduces the dimensional accuracy of holes punched therein, particularly if many small holes are punched in the sheet, and it cannot be fed at a highly accurate rate through the dies and punches.

The compound blank-and-pierce die assembly has as many punches as the number of holes in the die according to the machining pattern for the workpiece. If the machining pattern has many small holes, then the compound blank-and pierce die assembly is required to have as many punches of small diameters as the number of the holes in the die. It is relatively expensive to manufacture such punches of small diameters, and such punches of small diameters are liable to be damaged in use. As a result, the compound blank-and-pierce die assembly with many punches of small diameters needs a considerably complex maintenance process.

When a green sheet 3 (or an adhesive film) to be fired into a sintered product is pierced by a die 1 and punches 2, scraps 3a punched out are accumulated in holes 1a in the die 1.

On the other hand, when a metal sheet is punched by the die 1 and the punches 2, since the metal sheet has a large Young's modulus, scraps punched out do not plastically deform previous scraps, but successively displace them in the holes 1a and discharge them out of the holes 1a. Inasmuch as the green sheet 3 has a Young's modulus smaller than that of the metal sheet, the accumulated scraps 3a are pressed and plastically deformed by newly introduced scraps 3a, and stick together due to adhesive forces of a binder contained in the surface layer of the green sheet 3. As a result, the scraps 3a are firmly stuck in the holes 1a, applying stresses to the die 1 thereby to damage the die 1 or buckle the punches 2.

SUMMARY OF THE INVENTION

It is therefore an object of the present invention to provide an apparatus of relatively simple structure for progressively feeding and machining various sheet materials highly accurately and efficiently.

Another object of the present invention is to provide an apparatus for progressively feeding and machining a sheet material according to a machining pattern of holes, for example, having different sizes.

Still another object of the present invention is to provide an apparatus for progressively feeding and machining a sheet material while efficiently discharging scraps punched out of the sheet material in each machining cycle, with increased machining accuracy, increased reliability, and increased punch life.

Yet still another object of the present invention is to provide an apparatus for progressively feeding and machining a sheet material with punches arrayed at a highly accurate pitch highly reliably according to a fine punching pattern, while preventing the finely punched pattern of the sheet material from being broken under external forces.

The above and other objects, features, and advantages of the present invention will become apparent from the following description when taken in conjunction with the accompanying drawings in which preferred embodiments of the present invention are shown by way of example.

BRIEF DESCRIPTION OF THE DRAWINGS

FIG. 9A is a timing chart illustrative of a pattern of movement of the tip ends of punches of the progressively feeding and machining apparatus shown in FIG. 1 when a unit machining period "T" is smaller than 5 seconds (T<5 sec.);

FIG. 9B is a timing chart of a continuous vacuum suction process of a vacuum suction source of the progressively feeding and machining apparatus shown in FIG. 1;

FIG. 10 is a timing chart illustrative of patterns of movement, in a unit machining period, of the tip ends of punches and a lower surface of a stripper of the progressively feeding and machining apparatus shown in FIG. 1;

FIGS. 11A through 11C are fragmentary cross-sectional views showing the manner in which the punches and the stripper operate according to the timing chart shown in FIG. 10;

FIG. 12A is a timing chart illustrative of a pattern of movement of the tip ends of punches of the progressively feeding and machining apparatus shown in FIG. 1 when a unit machining period "T" is equal to or greater than 5 seconds (T≧5 sec.);

FIG. 12B is a timing chart of an intermittent vacuum suction process of the vacuum suction source of the progressively feeding and machining apparatus shown in FIG. 1;

FIG. 13A is a schematic fragmentary plan view of a progressively feeding and machining apparatus according to a first modification of the present invention;

FIG. 13B is a view similar to FIG. 13A, showing first and second upper punch bases with respect to which a die has been moved by a pitch between adjacent rows of holes punched in a green sheet;

FIG. 15 is a schematic fragmentary plan view of a progressively feeding and machining apparatus according to a third modification of the present invention;

FIG. 16 is a schematic fragmentary plan view of a progressively feeding and machining apparatus according to a fourth modification of the present invention;

FIG. 18A is a schematic fragmentary plan view of a progressively feeding and machining apparatus according to a sixth modification of the present invention;

FIG. 18B is a view similar to FIG. 18A, showing first and second upper punch bases with respect to which a die has been moved by twice a pitch between adjacent rows of holes punched in a green sheet;

FIG. 19A is a schematic fragmentary plan view of a progressively feeding and machining apparatus according to a seventh modification of the present invention;

FIG. 19B is a view similar to FIG. 19A, showing an upper punch base with respect to which a die has been moved by a pitch between adjacent rows of holes punched in a green sheet;

FIG. 24 is a fragmentary front elevational view of a punch block having an integral array of punches which can be supported on the upper punch base of the progressively feeding and machining apparatus;

FIG. 25 is a fragmentary plan view of the green sheet punched by an array of punches;

DETAILED DESCRIPTION OF THE PREFERRED EMBODIMENTS

Figure 1:
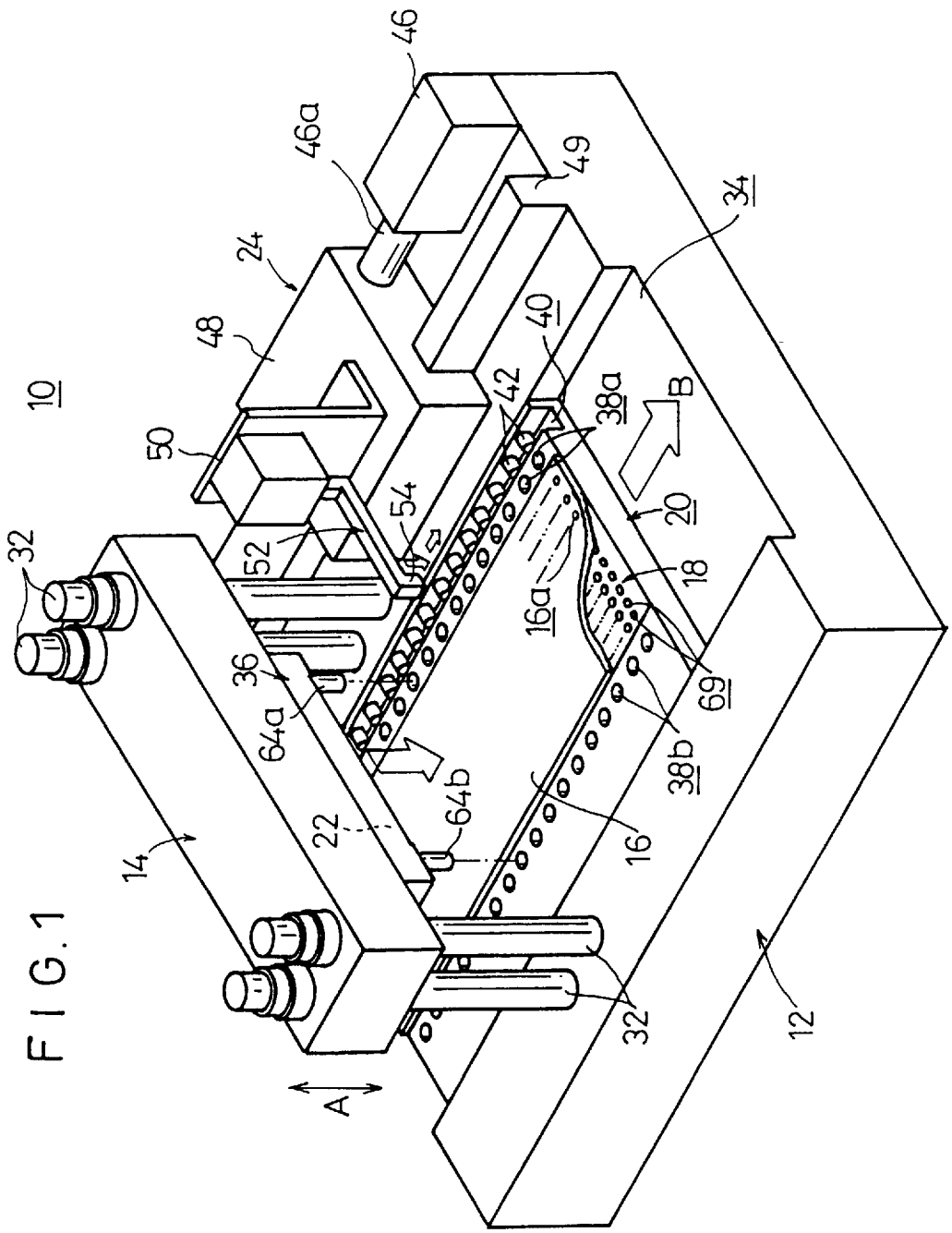
FIG. 1 is a perspective view of a progressively feeding and machining apparatus according to the present invention, which is used to progressively feeding and machining a green sheet.

Like or corresponding parts are denoted by like or corresponding reference characters throughout views.

As shown in FIG. 1, a progressively feeding and machining apparatus 10 according to the present invention, which is used to progressively feed and machine a green sheet, generally comprises a fixed lower die base 12, an upper punch base or machining head 14 movable vertically toward and away from the lower die base 12 in the directions indicated by the arrow A, a die 20 supporting a green sheet 16 to be fed and machined and movably disposed on the lower die base 12 for horizontal movement in the directions indicated by the arrow B, the die 20 having a machining pattern 18 for machining, i.e., punching, the green sheet 16, an array of punches 22 supported on the upper punch base 14 for punching the sheet 16 according to the machining pattern 18 in a predetermined number of machining cycles, a feed mechanism 24 for moving the die 20 with the green sheet 16 mounted thereon in the direction indicated by the arrow B to align a next machining position on the green sheet 16 with the array of punches 22 each time the green sheet 16 is punched by the die 20 and the array of punches 22 in a machining cycle, a suction chamber 26 (see FIG. 2) defined in the die 20 and held in communication with the machining pattern 18 of the die 20, and a closure means 30 for maintaining the suction chamber 26 under a certain vacuum while isolating a portion of the suction chamber 26 which corresponds to a machined region 18a of the machining pattern 18 when the suction chamber 26 is evacuated by a vacuum suction source 28 such as a vacuum pump, a suction blower, or the like.

The upper punch base 14 is vertically movably supported above the lower die base 12 by four main posts 32. The lower die base 12 has a guide groove 34 defined in an upper surface thereof below the upper punch base 14, which extends in the direction indicated by the arrow B. The die 20 is movably received in the guide groove 34 and has two arrays of positioning holes 38a, 38b defined in an upper surface thereof and positioned one on each side of the machining pattern 18. The positioning holes 38a, 38b are spaced at equal intervals in the direction indicated by the arrow B. The positioning holes 38a, 38b serve as part of a positioning means 36 for positioning the die 20 with respect to the punches 22.

The die 20 has a slot 40 defined in an upper surface thereof along a side edge thereof adjacent to the array of positioning holes 38a in the direction indicated by the arrow B. The slot 40 houses therein an array of equally spaced rollers 42 that are rotatable about respective horizontal axes.

Figure 4:
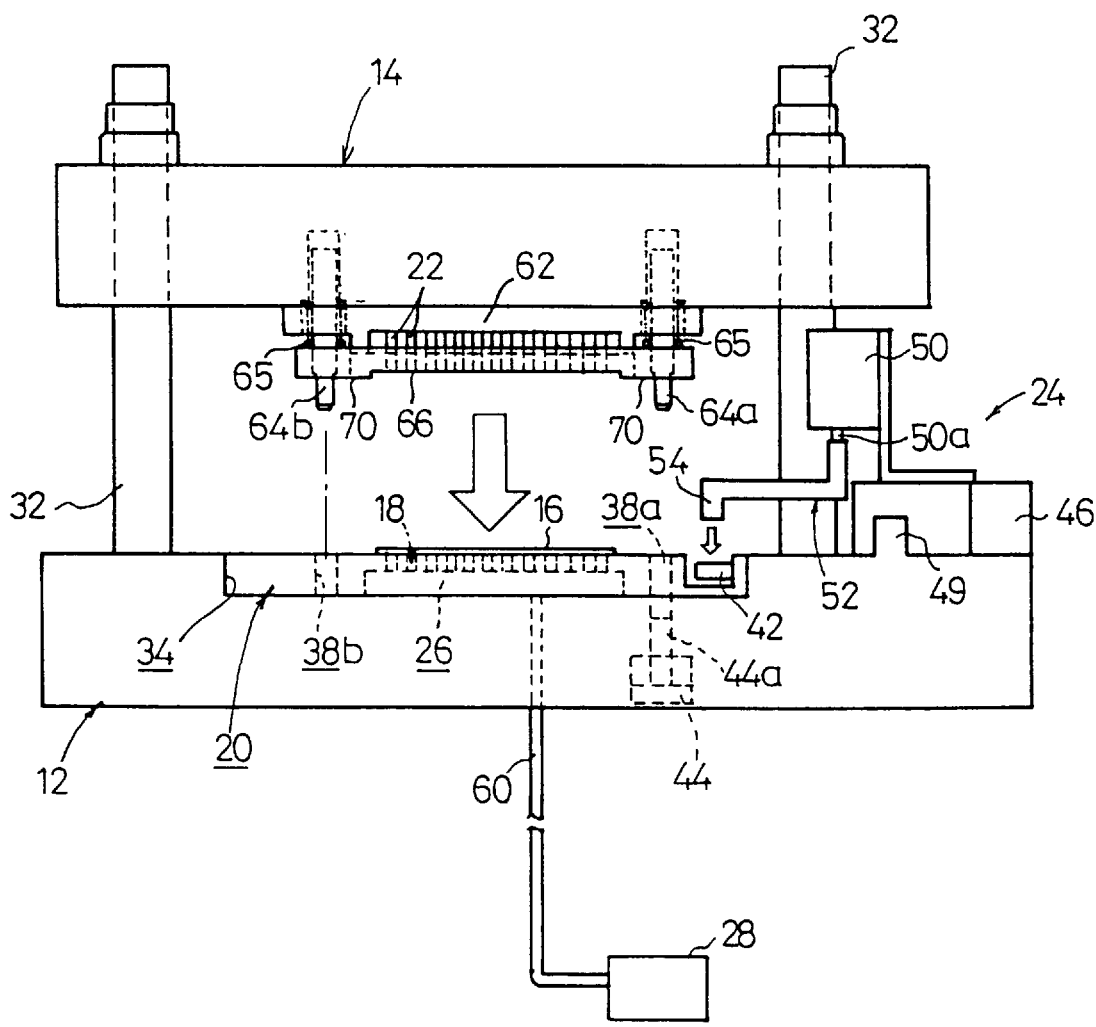
FIG. 4 is a side elevational view of the progressively feeding and machining apparatus shown in FIG. 1.
Figure 5:
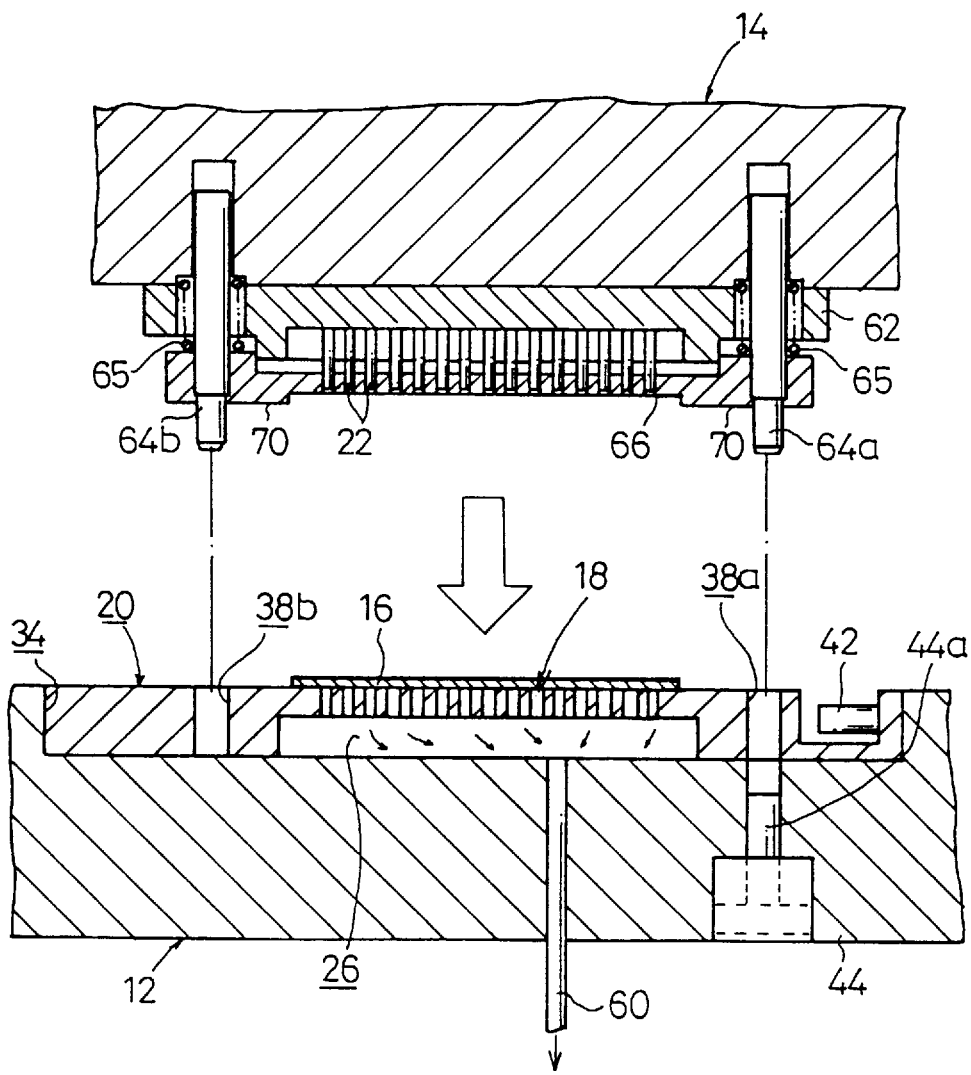
FIG. 5 is a fragmentary transverse vertical cross-sectional view of the progressively feeding and machining apparatus shown in FIG. 1, showing the position of the parts when punches are displaced upwardly from a die.

As shown in FIGS. 4 and 5, the lower die base 12 has a positioning cylinder 44 mounted therein underneath the guide groove 34 and having an upwardly extending rod 44a which can be fitted in one of the positioning holes 38a in the die 20 at a time.

As shown in FIG. 1, the feed mechanism 24 includes a first cylinder 46 fixedly mounted on the lower die base 12 and having a rod 46a extending in a direction opposite to the direction indicated by the arrow B. The rod 46a has a distal end coupled to a movable table 48 which is movably disposed on a rail 49 projecting upwardly from the lower die base 12 and extending parallel to the first cylinder 46.

The feed mechanism 24 also includes a second cylinder 50 mounted on the movable base 48 and having a downwardly extending rod 50a (see FIG. 4) to which an end of an engaging arm 52 is coupled. The engaging arm 52 extends horizontally to a position above the slot 40 and has on its opposite end a finger 54 projecting downwardly for being placed between adjacent two of the rollers 42.

Figure 2:
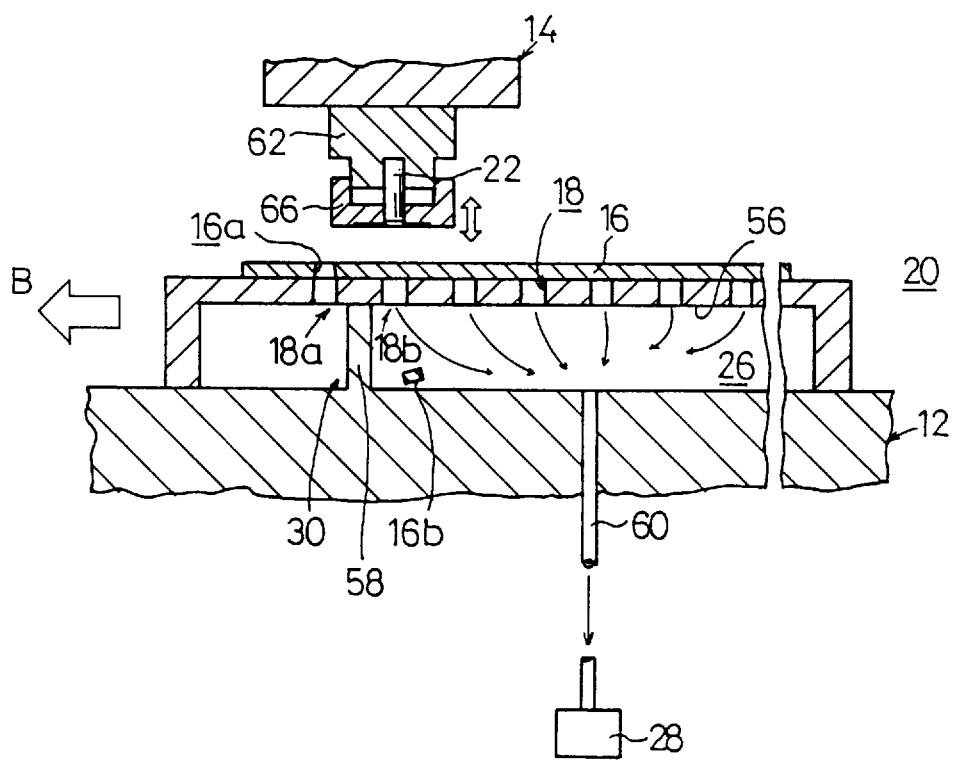
FIG. 2 is a fragmentary longitudinal vertical cross-sectional view of the progressively feeding and machining apparatus shown in FIG. 1.

As shown in FIG. 2, the closure means 30 has an upwardly extending partition 58 mounted on the lower die base 12 and cooperating with an inner wall surface 56 of the die 20 in defining a suction chamber 26 in the die 20. The partition 58 has an upper end held in sliding contact with the inner wall surface 56 between a position where the green sheet 16 is to be machined and a machined region 18a of the machining pattern 18 in order to isolate the machined region 18a from an unmachined region 18b of the machining pattern 18. The suction chamber 26 communicates with the vacuum suction source 28 through an air passage 60 which extends vertically through the lower die base 12.

Figure 3:
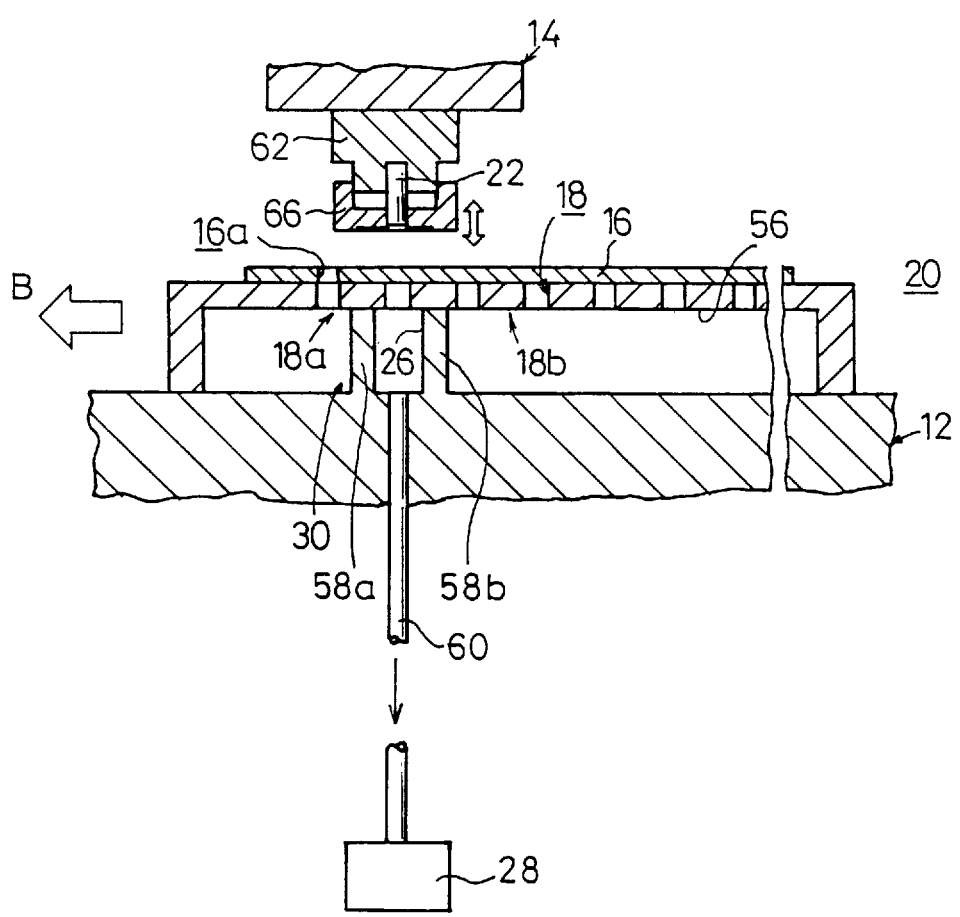
FIG. 3 is a fragmentary longitudinal vertical cross-sectional view of a progressively feeding and machining apparatus, with a different closure means, according to the present invention.

As shown in FIG. 3, the closure means 30 may comprise first and second horizontally spaced partitions 58a, 58b mounted upwardly on the lower die base 12 and cooperating with an inner wall surface 56 of the die 20 in defining a suction chamber 26 in the die 20.

In FIG. 3, the first partition 58a has an upper end held in sliding contact with the inner wall surface 56 between a position where the green sheet 16 is to be machined and a machined region 18a of the machining pattern 18 in order to isolate the machined region 18a from an unmachined region 18b of the machining pattern 18. The second partition 58b has an upper end held in sliding contact with the inner wall surface 56 between the position where the green sheet 16 is to be machined and the unmachined region 18b of the machining pattern 18 in order to isolate the machined region 18a from the unmachined region 18b. The suction chamber 26 communicates with the vacuum suction source 28 through an air passage 60 which extends vertically through the lower die base 12.

As shown in FIGS. 4 and 5, the punches 22 are supported on a lower surface of a punch holder 62 which is mounted on a lower surface of the upper punch base 14. Two auxiliary posts 64a, 64b which are horizontally spaced from each other are vertically movably received in the upper punch base 14, and extend vertically movably downwardly through the punch holder 62 for being selectively inserted into the positioning holes 38a, 38b in the die 20.

A stripper 66 is fixedly mounted on lower end portions of the auxiliary posts 64a, 64b which are positioned respectively at opposite end portions of the stripper 66. The stripper 66 is normally biased to move downwardly by helical compression springs 65 disposed respectively around the auxiliary posts 64a, 64b and acting between the upper punch base 14 and the stripper 66. The stripper 66 is normally biased by the helical compression springs 65 so as to be spaced downwardly a certain distance from the punch holder 62. When the upper punch base 14 is lowered toward the lower die base 12 after the stripper 66 has contacted the green sheet 16, the stripper 66 is displaced toward the punch holder 62 against the bias of the helical compression springs 65.

The stripper 66 may be supported by an alternative structure as follows: The stripper 66 is supported at one end portion thereof by a bolt which has an upper end threaded into the upper punch base 14 and extends loosely through the punch holder 62 and the stripper 66. The bolt has a head on its lower end which keeps the stripper 66 from dropping toward the die 20. A helical compression spring is disposed around the bolt and acts between the upper punch base 14 and the stripper 66 for normally biasing the stripper 66 to move downwardly. An auxiliary post, similar to each of the auxiliary posts 64a, 64b, is vertically movably received in the upper punch base 14 and extends through the punch holder 62. The auxiliary post has a lower end portion fixedly mounted on an opposite side of the stripper 66. Another helical compression spring is disposed around the auxiliary post and acts between the upper punch base 14 and the stripper 66 for normally biasing the stripper 66 to move downwardly. A ball bushing is mounted on an upper portion of the auxiliary post for positioning the stripper 66 and the punch holder 62 with respect to each other and allowing them to move relatively to each other.

Figure 6:
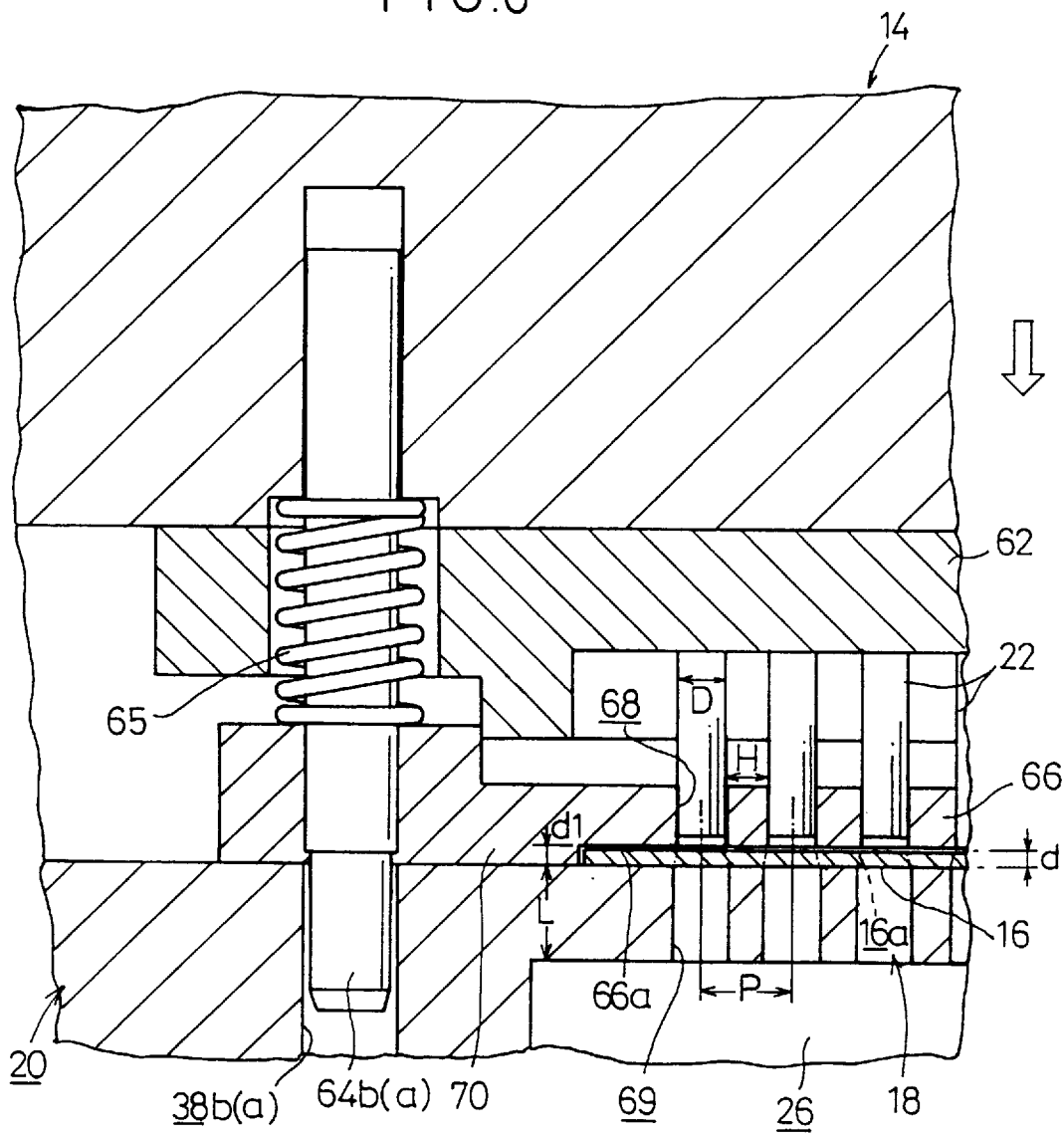
FIG. 6 is an enlarged fragmentary transverse vertical cross-sectional view of the progressively feeding and machining apparatus shown in FIG. 1, showing the position of the parts when the punches are displaced downwardly to the die.

As shown in FIG. 6, the stripper 66 has an array of punch guide holes 68 which receive the punches 22, respectively. The punch guide holes 68 have a diameter which is smaller than the diameter of holes 69 defined in the machining pattern 18. The stripper 66 has integral shims 70 disposed at the respective opposite end portions thereof and projecting downwardly a distance or thickness "d1" from a lower surface 66a of the stripper 66. The shims 70 are horizontally positioned outside of respective opposite edges of the green sheet 16 placed on the die 20, and hence will be held in direct contact with the upper surface of the die 20 when the upper punch base 14 is lowered toward the lower die base 12.

The green sheet 16 has a thickness "d" of 0.2 mm or less. The thickness "d1" of the shims 70 is equal to or greater than the thickness "d" of the green sheet 16 (d1≧d). In the illustrated embodiment, the thickness "d" is of 0.185 mm, and the thickness "d1" is of 0.19 mm. Each of the punches 22 has a diameter "D" of 0.3 mm or less, the punches 22 are spaced at a pitch "P" of 0.6 mm or less, and a minimum dimension "H" between holes 16a to be punched in the green sheet 16 is of 0.3 mm or less.

A basic process of operation of the progressively feeding and machining apparatus 10 will be described below with reference to FIGS. 5 through 8, 9A and 9B. In the illustrated embodiment, the progressively feeding and machining apparatus 10 is controlled for its operation by a seqeuncer. However, the progressively feeding and machining apparatus 10 may be controlled for its operation according to a relay sequence or by a computer.

As shown in FIG. 5, the green sheet 16 is placed on the die 20 while the upper punch base 14 is being elevated off the lower die base 12 with the tip ends of the punches 22 being in their uppermost position. Then, a start button on a control console (not shown) is pressed to start a process of progressively feeding and machining the green sheet 16 at a time t0 in FIG. 9A.

At a time t1, which is 2 seconds, for example, after the time t0, the positioning cylinder 44 is operated to insert the rod 44a into one of the positioning holes 38a for thereby temporarily positioning the die 20 with respect to the lower die base 12. At a time t2, which is about 1.6 seconds from the time t1, the vacuum suction source 28 is actuated to evacuate the suction chamber 26 through the air passage 60. The green sheet 16 is attracted to the upper surface of the die 20 under vacuum through the machining pattern 18 which communicates with the suction chamber 26. Therefore, there is required no means for applying external forces to press the green sheet 16 to hold it in place on the die 20, and hence the green sheet 16 is prevented from being unduly strained.

At a time t3, which is about 4 seconds from the time t0, the upper punch base 14 is lowered along the main posts 32 toward the lower die base 12. The auxiliary posts 64a, 64b are fitted in respective ones of the positioning holes 38a, 38b. The die 20 is now accurately positioned relatively to the upper punch base 14, as shown in FIG. 6. The shims 70 on the opposite end portions of the stripper 66 are resiliently held against the upper surface of the die 20 by the helical compression springs 65 out of interference with the green sheet 16.

Figure 7:
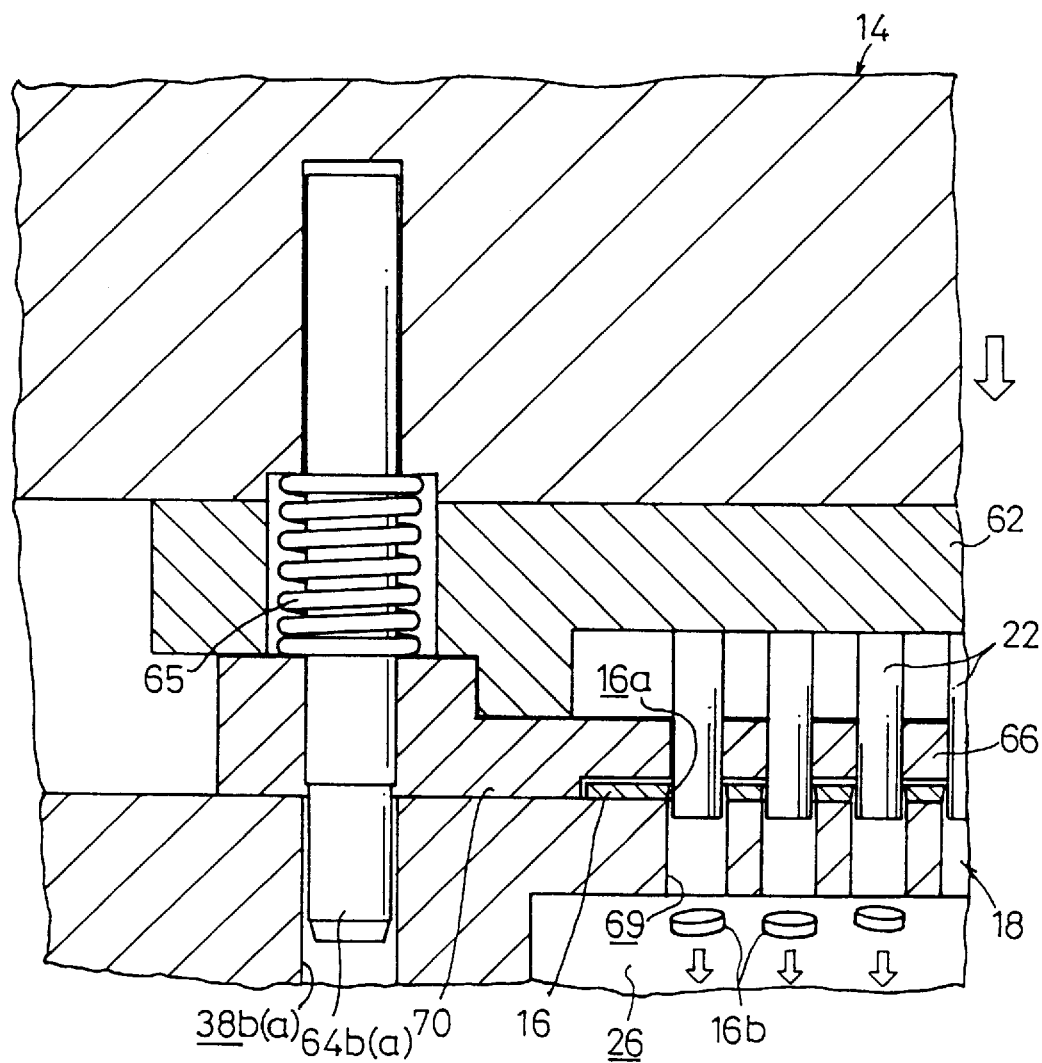
FIG. 7 is an enlarged fragmentary transverse vertical cross-sectional view of the progressively feeding and machining apparatus shown in FIG. 1, showing the position of the parts when holes are punched in a sheet material by the punches in coaction with the die.

As shown in FIG. 7, continued downward movement of the upper punch base 14 causes the punches 22 to pierce the green sheet 16, forming holes 16a in the green sheet 16 at a certain machining position thereon. The tip ends of the punches 22 reach their lowermost position at a time t4. The tip ends of the punches 22 are maintained in the lowermost position from the time t4 to a time t5 which is about 1.8 seconds after the time t4.

At this time, as shown in FIG. 7, the suction chamber 26 is kept under a certain vacuum by the vacuum suction source 28. Therefore, scraps 16b punched out of the green sheet 16 by the punches 22 do not remain in the machined region 18a of the machining pattern 18, but are attracted into the suction chamber 26. Though the green sheet 16 has a smaller Young's modulus than metal and is sticky, the scraps 16b punched out of the green sheet 16 do not stick to the machined region 18a and hence do not apply stresses to the die 20. Consequently, the die 20 is prevented from being damaged by the scraps 16b, and the punches 22 are prevented from being buckled by the scraps 16b.

Figure 8:
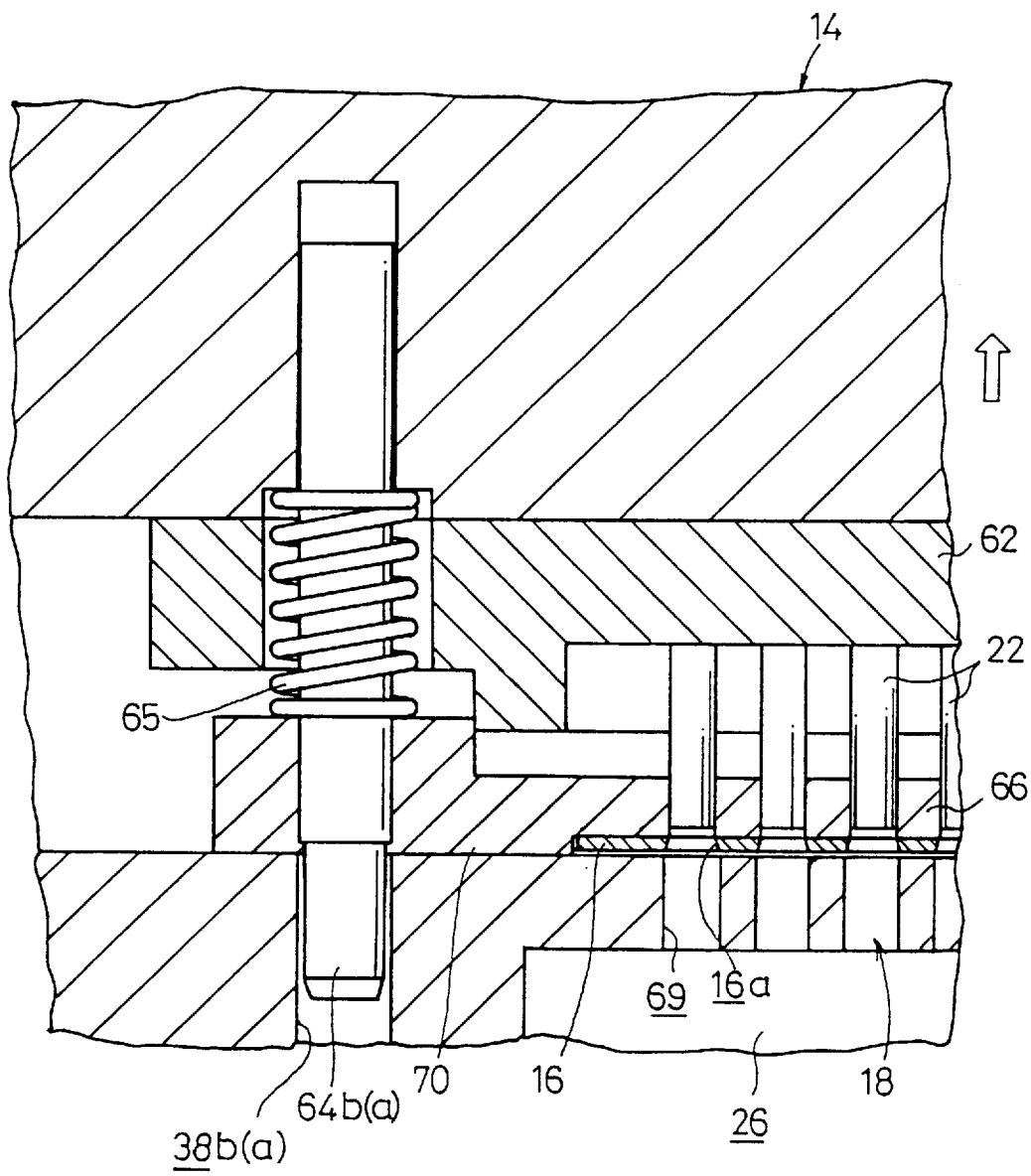
FIG. 8 is an enlarged fragmentary transverse vertical cross-sectional view of the progressively feeding and machining apparatus shown in FIG. 1, showing the position of the parts when the punches are being elevated away from the die.

After the punches 22 have formed the holes 16a in the green sheet 16 at the machining position, the upper punch base 14 is elevated at the time t5, as shown in FIG. 8. Upon ascent, the punches 22 which are fitted in the respective holes 16a tend to move the green sheet 16 upwardly therewith. However, since the stripper 66 are biased against the die 20 by the helical compression springs 65, the green sheet 16 is held by the stripper 66 against upward movement away from the die 20. The punches 22 are thus reliably separated from the green sheet 16, which is free from damage due to stress concentration or the like.

When the positioning cylinder 44 is actuated to retract the rod 44a from the positioning hole 38a and the tip ends of the punches 22 reach their uppermost position at a time t6, the second cylinder 50 of the feed mechanism 24 is operated to lower the engaging arm 52 with its rod 50a until the finger 54 is inserted between adjacent two of the rollers 42. The first cylinder 46 is then actuated to cause the rod 46a to move the movable base 48 a predetermined distance in the direction indicated by the arrow B (see FIGS. 1 and 2). The die 20 is now moved a given distance, e.g., the pitch between the rollers 42 or an interval or pitch between two adjacent rows of holes 16a to be formed in the green sheet 16, in the direction indicated by the arrow B by the finger 54 engaging the rollers 42.

Then, the positioning cylinder 44 is operated to insert the rod 44a into another one of the positioning holes 48a. The engaging arm 52 is lifted by the second cylinder 50, and then returned together with the movable base 48 to a given standby position by the first cylinder 46. The green sheet 16 on the die 20 is positioned with its new machining position aligned with the punches 22 at a time t7. From the time t7, the upper punch base 14 is lowered again to cause the punches 22 to punch another row of holes 16a in the green sheet 16 at the new machining position thereon.

The above punching process carried out by the progressively feeding and machining apparatus 10 is summarized as follows: The upper punch base 14 is lowered from its upper position where the tip ends of the punches 22 are located in the uppermost position until the punches 22 pierce the green sheet 16 at a certain machining position thereon with the tip ends thereof reaching the lowermost position. Thereafter, the upper punch base 14 is lifted until the tip ends of the punches 22 go back to the uppermost position again, whereupon the feed mechanism 24 moves the die 20 to align a new machining position on the green sheet 16 with the punches 22. When the upper punch base 14 is positioned at the new machining position on the green sheet 16 by the positioning means 36, the upper punch base 14 is lowered again toward the new machining position on the green sheet 16. The period from the time t3 when the upper punch base 14 starts being lowered to the time t7 when the upper punch base 14 starts being lowered again is defined as a unit machining period "T".

When the die 20 has moved the pitch between the rollers 42 in the direction indicated by the arrow B, as shown in FIG. 2, the partition 58 of the closure means 30 is slidably held against the inner wall surface 56 between the machined region 18a and the unmachined region 18b of the machining pattern 18. Therefore, the machined region 18a, which is held under the atmospheric pressure through the punched holes 16a, is isolated by the partition 58 from the suction chamber 26 which is defined between the partition 58 and the inner wall surface 56. The suction chamber 26 is reliably maintained under a vacuum by the vacuum suction source 28 for holding the green sheet 16 reliably in position on the die 20. In addition, scraps 16b which are produced when the green sheet 16 is punched at a new machining position thereon are reliably attracted into the suction chamber 26 under the vacuum developed therein.

If the closure means 30 comprises the first and second partitions 58a, 58b as shown in FIG. 3, then the unmachined region 18b of the machining pattern 18, other than the machined region 18a and a region to be immediately machined by the punches 22, is isolated from the suction chamber 26 which is defined by the first and second partitions 58a, 58b and the inner wall surface 56. The suction chamber 26 is maintained under a vacuum by the vacuum suction source 28 for attracting only the green sheet 16 on the region to be immediately machined. Consequently, since the green sheet 16 on the unmachined region 18b is not attracted under the vacuum in the suction chamber 26, the green sheet 16 on the unmachined region 18b is prevented from being unnecessarily deformed under the vacuum. As a result, the green sheet 16 on the region to be immediately machined can be pierced by the punches 22 with high dimensional accuracy.

The shims 70 on the opposite end portions of the stripper 66 project downwardly the thickness "d1" from the lower surface 66a of the stripper 66, the thickness "d1" being equal to or greater than the thickness "d" of the green sheet 16 (d1≧d). When the shims 70 are biased into direct contact with the upper surface of the die 20 by the helical compression springs 65, therefore, the lower surface 66a of the stripper 66 does not unduly press the green sheet 16, which is prevented from being marked or damaged.

The green sheet 16 placed on the die 20 equipped with the machining pattern 18 is successively fed and machined when the unit machining period or cycle is repeated on the green sheet 16. Specifically, while the die 20 and the green sheet 16 are being intermittently fed in the direction indicated by the arrow B by the feed mechanism 24, the punches 22 and the die 20 act with each other to punch the green sheet 16 in successive punching cycles.

After all the holes 16a are punched in the green sheet 16 according to the machining pattern 18, i.e., all the machining pattern 18 is transferred to the green sheet 16, when the tip ends of the punches 22 reach the uppermost position at a time t8, the evacuation by the vacuum suction source 18 of the suction chamber 26 is stopped, and the pressure in the suction chamber 26 returns to the atmospheric pressure at a time t9 which is about 0.4 second after the time t8. Subsequently, the machined green sheet 16 is removed from the die 20, putting an end to the process of progressively feeding and machining the green sheet 16.

Since the green sheet 16 sticks to and moves in unison with the die 20 at all times in the above feeding and machining process, no unduly external forces are imposed on the green sheet 16, and hence the green sheet 16 is prevented from being unduly strained even though the green sheet 16 is soft and thin. As a consequence, the dimensional accuracy of the machining pattern 18, which is a fine punching pattern, can be maintained to punch the holes 16a highly accurately and efficiently in the green sheet 16.

Inasmuch as no undue strain or stress is developed in the green sheet 16, the green sheet 16 is prevented from being strained when it is fired, and can thus be fired into a high-quality sintered product.

Because the diameter of the punch guide holes 68 is smaller than the diameter of holes 69 defined in the machining pattern 18, the holes 16a punched in the green sheet 16 can be of a tapered shape which progressively spreads toward the die 20, as shown in FIG. 7. The tapered holes 16a may be formed as closely as possible in the green sheet 16, and allow a fine punching pattern for punching many small holes to be produced easily and efficiently as the machining pattern 18.

Details of operation in the unit machining period of the progressively feeding and machining apparatus 10 will be described below with reference to FIG. 10 and 11A through 11C. In FIG. 10, a pattern of movement of the tip ends of the punches 22 is indicated by the solid-line curve, and a pattern of movement of the lower surface of the stripper 66 by the dotted-line curve. The punch 22 shown in FIGS. 11A through 11C, which is typical of all the punches 22, has a length large enough to cause its tip end to project through the hole 69 in the die 20 into the suction chamber 26 when the tip end of the punch 22 reaches the lowermost position. The punch 22 of such a length is effective to eject a punched-out scrap reliably into the suction chamber 26.

In an initial state during an interval "a" in FIG. 10, the tip end of the punch 22 is positioned above the lower surface of the stripper 66, and appears retracted in the stripper 66, as shown in FIG. 11A. At this time, the tip end of the punch 22 is spaced upwardly from the lower surface of the stripper 66 by a distance a of about 0.4 mm.

In a next stage during an interval "b" in FIG. 10, the punch 22 and the stripper 66 descend until the tip ends of the punches 22 contact the green sheet 16. Specifically, at the beginning of the interval "b" at a time t3, the punch 22 and the stripper 66 start descending while keeping their positional relationship shown in FIG. 11A. At a time t11 prior to a time t12 at the end of the interval "b", the lower ends of the shims 70 contact the die 20, stopping the downward movement of the stripper 66.

In FIG. 11B, the lower surface of the stripper 66 is shown as being held against the upper surface of the green sheet 16. However, depending on the height of the shims 70, there may be created a slight clearance between the lower surface of the stripper 66 and the upper surface of the green sheet 16.

In a next stage during an interval "c", the punch 22 pierces the green sheet 16. Specifically, in the interval "c", the punch 22 is lowered from the stripper 66 at substantially the same speed as the speed of downward movement in the interval "b", piercing the green sheet 16. The stroke β by which the punch 22 descends with respect to the stripper 66 in the interval "c" is equal to the sum of the thickness "d" (=about 0.185 mm) of the green sheet 16, the thickness "d2" (=about 2 mm) of the die 20, and the distance "d3" (=about 0.1 mm) by which the punch 22 projects downwardly from the lower surface of the die 20. Therefore, the stroke β is of about 2.285 mm. At a time t4 at the end of the interval "c", the tip end of the punch 22 reaches its lowermost position.

In a next stage during an interval "d", the tip end of the punch 22 is kept in the lowermost position. In the illustrated embodiment, the interval "d" is 0.5 sec. long. In the interval "d", as shown in FIG. 7, scraps 16b punched out of the green sheet 16 by the punches 22 do not remain in the machined region 18a (see FIG. 2) of the machining pattern 18, but are attracted into the suction chamber 26 under the vacuum which has been developed in the suction chamber 26 by the vacuum suction source 26.

In a next stage during an interval "e", the upper punch base 14 is elevated to bring its tip end to a given position with respect to the stripper 66. The upper punch base 14 ascends at a speed of about 10 mm/s. Specifically, the punch 22 starts being lifted from a time t5 at the end of the interval "d". The tip end of the punch 22 leaves the green sheet 16 at a time t13, and the punch 22 continuously moves upwardly at the speed of about 10 mm/s. The tip end of the punch 22 is then retracted into the stripper 66. When the tip end of the punch 22 is spaced upwardly the distance a of about 0.4 mm from the lower surface of the stripper 66 at a time t14, the punch 22 and the stripper 66 start ascending together. The stripper 66 is therefore lifted at the speed of about 10 mm/s.

At a time t15 when the lower surface of the stripper 66 is spaced upwardly a distance y of about 0.1 mm from the upper surface of the green sheet 16, the punch 22 and the stripper 66 stop moving upwardly. The punch 22 and the stripper 66 remain at rest for about 1 sec. during an interval "f". In this interval "f", as shown in FIG. 11C, a gap 72 created between the lower surface of the stripper 66 and the upper surface of the green sheet 16 communicates with the suction chamber 26.

While the punch 22 is being held at rest in the interval "f", air flows over the upper surface of the green sheet 16 through the gap 72 into the suction chamber 26, removing scraps and dirt and dust particles which may have been present on the upper surface of the green sheet 16 efficiently into the suction chamber 26.

In a next stage during an interval "g", the upper punch base 14 is elevated again back to its initial state. In the interval "g", the punch 22 ascends at a speed of about 150 mm/s. At a time t6 at the end of the interval "g", the tip end of the punch 22 reaches the uppermost position.

The vacuum suction source 28 is operated to continuously evacuate the suction chamber 26 (see FIG. 9B) in a continuous vacuum suction process if the unit machining period "T" is less than 5 sec., as shown in FIG. 9A, and intermittently evacuate the suction chamber 26 (see FIG. 12B) in an intermittent vacuum suction process if the unit machining period "T" is 5 sec. or more, as shown in FIG. 12A.

In the continuous vacuum suction process, the vacuum suction source 28 starts operating at the time t2 immediately prior to the time t3 when the upper punch base 14 starts being lowered, and continuously evacuates the suction chamber 26 until the vacuum suction source 28 stops operating at the time t8 when the green sheet 16 is punched fully according to the machining pattern 18.

In the intermittent vacuum suction process, the vacuum suction source 28 starts operating at the time t2 immediately prior to the time t3 when the upper punch base 14 starts being lowered, and stops operating when one row of holes 16a is punched in the green sheet 16. Such a cycle is intermittently repeated in each unit machining period "T". The vacuum suction source 28 remains inactive almost entirely during the feeding of the die 20 in each unit machining period "T".

Each unit machining period "T" is composed of a machining period of time in which the green sheet 16 is actually punched by the punch and a feeding period of time in which the die 20 is fed to bring a next machining position thereon into alignment with the upper punch base 14. Since the machining period of time remains substantially constant regardless of the length of the feeding period of time, as shown in FIGS. 9A and 12A, the length of the unit machining period "T" is governed by the length of the feeding period of time. Consequently, if the unit machining period "T" increases to 5 sec. or longer, then the feeding period of time increases accordingly.

If the suction chamber 26 were continuously evacuated in the continuous vacuum suction process when the unit machining period "T" is of 5 sec. or longer, then since the green sheet 16 would be attracted under vacuum during the relatively long feeding period of time, the green sheet 16 on the unmachined region 18b would be unduly flexed under vacuum, causing wrinkles in itself.

According to the present invention, however, inasmuch as the suction chamber 26 is intermittently evacuated in the intermittent vacuum suction process when the unit machining period "T" is of 5 sec. or longer, the green sheet 16 is not attracted under vacuum during the relatively long feeding period of time, the green sheet 16 on the unmachined region 18b is not wrinkled.

In the continuous vacuum suction process, if the vacuum suction source 28 started evacuating the suction chamber 26 too early, e.g., before the time t1, or stopped evacuating the suction chamber 26 too late, e.g., 3 seconds after the time t8, then the period of time after the start of evacuation of the suction chamber 26 until the start of actual punching of the green sheet 16 by the punches 22, or the period of time after the entire punching of the green sheet 16 according to the machining pattern 18 until the end of evacuation of the suction chamber 26 would be too long, resulting in wrinkles in the green sheet 16.

According to the present invention, as shown in FIGS. 9A and 9B, the vacuum suction source 28 starts evacuating the suction chamber 26 at the time t2 which is about 0.4 second before the time t3 when the upper punch base 14 starts descending, and the vacuum suction source 28 stops evacuating the suction chamber 26 substantially at the time t8 when the tip ends of the punches 22 return to their uppermost position, i.e., after the entire punching of the green sheet 16 according to the machining pattern 18. Consequently, the green sheet 16 is prevented from being wrinkled, and is punched highly accurately according to the machining pattern 18.

The green sheet 16 contains particles having a maximum diameter of 5 μm. Therefore, the diameter of the punch guide holes 68 is set to a value which is the sum of the diameter "D" of the punches 22 and 10 μm, and the diameter of the holes 69 in the die 20 is set to a value which is the sum of the diameter "D" of the punches 22 and 20 μm. With these diameters, clearances between the punches 22 and the holes 68, 69 are minimized, and the particles contained in the green sheet 16 are not sheared when it is punched by the punches 22. The service life of the progressively feeding and machining apparatus 10 is thus prolonged.

Inasmuch as the number of punches 22 is relatively small, e.g., the punches 22 may be provided in a single array, the cost of the progressively feeding and machining apparatus 10 is relatively low, and hence any maintenance process required for servicing the progressively feeding and machining apparatus 10 when any of the punches 22 are damaged or reach the end of their service life. Because the accuracy of the holes 16a depends upon the dimensional accuracy of the punches 22, undue variations in the accuracy of the holes 16a are relatively small as the number of punches 22 is relatively small.

If the machining pattern 18 is a pattern for punching many small holes, the punches 22 are usually fabricated by a grinding process and the machining pattern 18 is usually formed by a discharging process. Therefore, the service life of the die 20 tends to be relatively short due to the presence of a modified layer generated in the discharging process. Since the punches 22 are used more frequently than the machining pattern 18, the times for maintenance for the punches 22 and the die 20 are substantially in agreement with each other. As a consequence, the maintenance process for the punches 22 and the die 20 can be carried out efficiently.

In the illustrated embodiment, the feed mechanism 24 has the first and second cylinders 46, 50 to move the engaging arm 52. However, the feed mechanism 24 may comprise a computerized numerical control (CNC) device including a CNC actuator for positioning the die 20 with respect to the lower die base 12. If such a CNC device is employed, then it is preferable that the die 20 and the CNC actuator be displaceable with respect to each other in a predetermined range in view of relative positioning errors which may be caused by the lower die base 12 and the die 20.

In the illustrated embodiment, the die 20 moves uniaxially in the direction indicated by the arrow B, and the upper punch base 14 and the die 20 are positioned relatively to each other by the auxiliary posts 64a, 64b. However, the die 20 may move biaxially in the direction indicated by the arrow B and a direction perpendicular thereto under the control of a numerical control system, with the auxiliary posts 64a, 64b being dispensed with. In such a case, the accuracy with which the upper punch base 14 and the die 20 are positioned relatively to each other is determined by the accuracy with which the die 20 is positioned under the control of such a numerical control system. Such a modification is also effective in preventing undue external forces from being applied to the green sheet 16.

While the shims 70 are integral with the stripper 66 in the illustrated embodiment, the shims 70 may be mounted on the die 20. The progressively feeding and machining apparatus 10 may be used to feed and machine any of various sheets such as a thin adhesive sheet, rather than the green she et 16. When the progressively feeding and machining apparatus 10 is used to feed and machine the green sheet 16, since the green sheet 16 is soft, the die 20 remain sufficiently rigid even if the thickness "L" (see FIG. 6) of the die 20 is considerably reduced. Therefore, even if the diameter of the punches 22 is considerably small, the thickness "L" of the die 20 may be selected so as to permit the punches 22 to pass through the holes 69 in the die 20 when they punch holes 16a in the green sheet 16. As a consequence, even if the punches 22 are considerably slender, the punches 22 can eject scraps 16b out of the holes 69, and the holes 69 are prevented from being clogged by scraps 16b when the holes 16a are punched in the green sheet 16 by the punches 22.

Modifications of the progressively feeding and machining apparatus 10 will be described below with reference to FIGS. 13A through 23F. As shown in FIGS. 13A through 16, progressively feeding and machining apparatus 10A~10D according to first through fourth modifications of the present invention serve to progressively feed and machine a green sheet 16 according to a machining pattern (hereinafter referred to as a "first machining pattern") 82A which has a plurality of transverse arrays of alternate holes 80a, 80b of larger and smaller diameters. As shown in FIGS. 17A through 19B, progressively feeding and machining apparatus 10E~10G according to fifth through seventh modifications of the present invention serve to progressively feed and machine a green sheet 16 according to a machining pattern (hereinafter referred to as a "second machining pattern") 82B which has a plurality of transverse arrays of holes 80a of a larger diameter and a plurality of transverse arrays of holes 80b of a smaller diameter, two of the transverse arrays of holes 80b being positioned one on each side of each of the transverse arrays of holes 80a.

The progressively feeding and machining apparatus 10A according to the first modification is essentially similar in structure to the progressively feeding and machining apparatus 10. However, as schematically shown in FIGS. 13A and 13B, the progressively feeding and machining apparatus 10A has first and second upper punch bases 14A, 14B. The first upper punch base 14A, which is positioned upstream of the second upper punch base 14B in the direction in which the green sheet 16 is fed, supports on its lower surface an array of punches 22A for punching holes 80a of a larger diameter in the green sheet 16, and the second upper punch base 14B, which is positioned downstream of the first upper punch base 14B in the direction in which the green sheet 16 is fed, supports on its lower surface an array of punches 22B for punching holes 80b of a smaller diameter in the green sheet 16. Therefore, the punches 22A on the first upper punch base 14A have a diameter larger than the punches 22B on the second upper punch base 14B. The first and second upper punch bases 14A, 14B have respective axes spaced from each other by a distance "W1" which is equal to "1P" or "2P", for example, where "P" represents the pitch between adjacent arrays of holes of the machining pattern 82A. The first and second upper punch bases 14A, 14B are vertically movable in unison with each other.

When the first and second upper punch bases 14A, 14B are vertically moved in one cycle, the punches 22A on the first upper punch base 14A form an array of larger holes 80a in the green sheet 16 in an nth row of the machining pattern 82A, and the punches 22B on the second upper punch base 14B form an array of smaller holes 80b in the green sheet 16 in an (n-2)th row of the machining pattern 82A.

In each unit machining period "T", the first and second upper punch bases 14A, 14B are vertically moved with respect to the die 20 to punch holes 80a, 80b in the green sheet 16, and the die 20 is fed the pitch "P" with respect to the first and second upper punch bases 14A, 14B, as shown in FIG. 13B, for thereby successively punching holes 80a, 80b in the green sheet 16 according to the machining pattern 82A.

Figure 20:
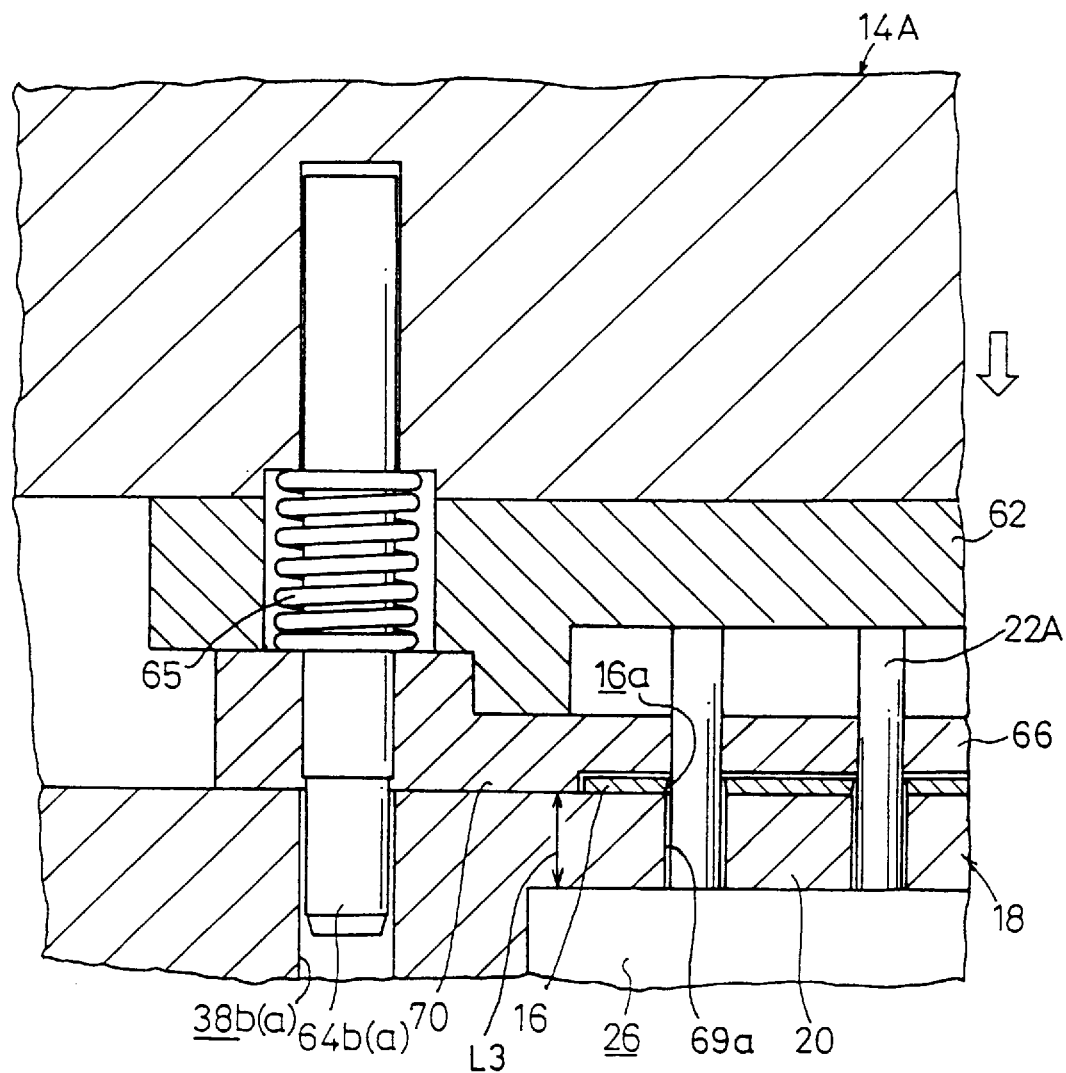
FIG. 20 is an enlarged fragmentary transverse vertical cross-sectional view of each of the progressively feeding and machining apparatus according to the first, second, fifth, and sixth modifications, showing the first upper punch base.

As shown in FIG. 20, the first upper punch base 14A is essentially identical in structure to the upper punch base 14 of the progressively feeding and machining apparatus 10.

Figure 21:
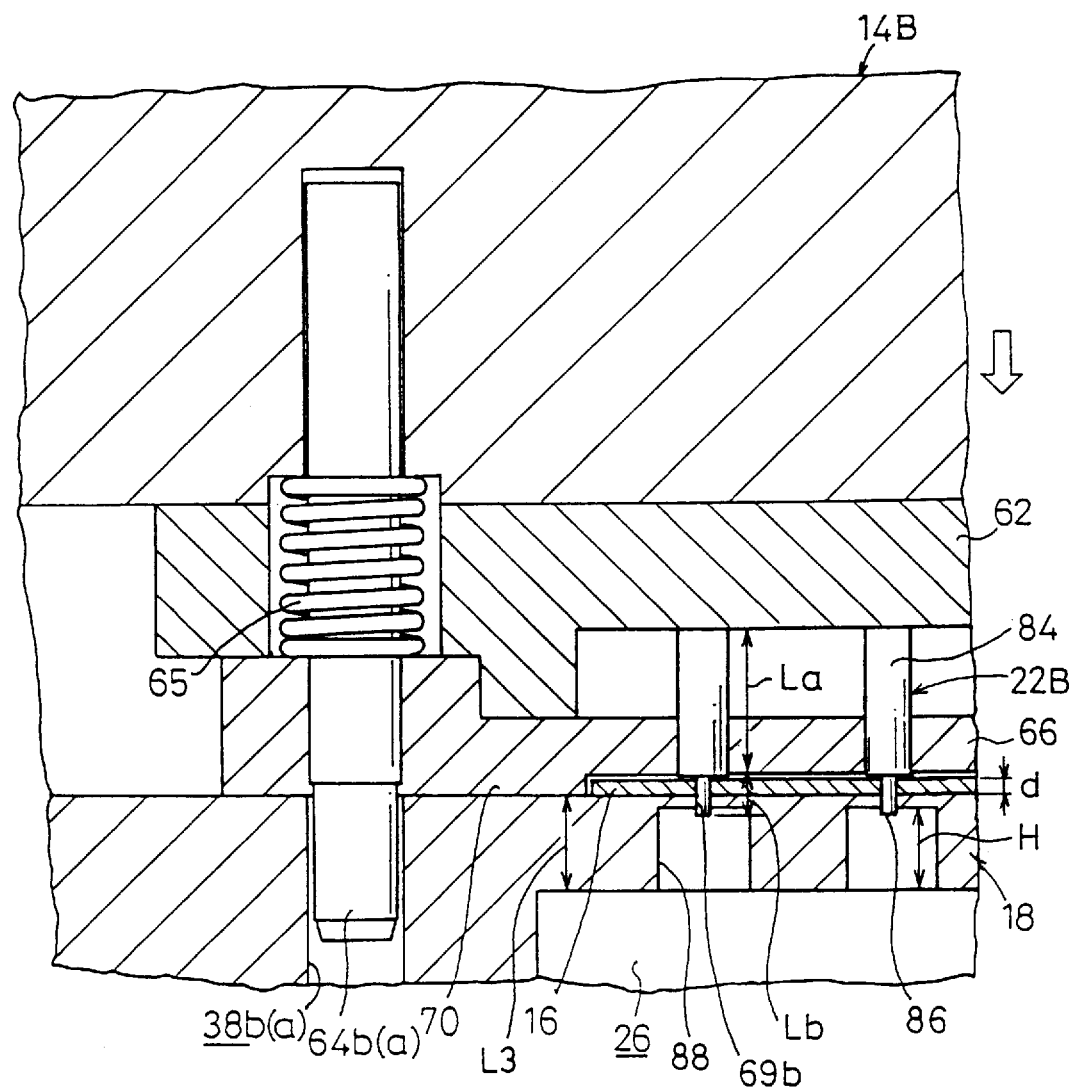
FIG. 21 is an enlarged fragmentary transverse vertical cross-sectional view of each of the progressively feeding and machining apparatus according to the first, second, fifth, and sixth modifications, showing the second upper punch base.

As shown in FIG. 21, the second upper punch base 14B is similar in structure to the upper punch base 14 of the progressively feeding and machining apparatus 10. However, the punches 22B on the second upper punch base 14B are shorter than the punches 22A on the first upper punch base 14A, and each of the punches 22B has a proximal portion 84 extending from the punch holder 62 over a length "La" and a tip end portion 86 extending from the proximal portion 84 over a length "Lb". The proximal portion 84 has a diameter which is substantially the same as the diameter of the punches 22A on the first upper punch base 14A. The tip end portion 86, which serves to punch a hole in the green sheet 16, has a diameter which is substantially the same as the diameter of smaller holes 80b to be punched in the green sheet 16. The length "Lb" of the tip end portion 86 is equal to the sum of a distance of 0.1 mm by which it projects from the die 20, the thickness of the die 20, the thickness "d" of the green sheet 16, and an auxiliary clearance of 0.1 mm by which the green sheet 16 is spaced from the stripper 66.

The die 20 of the progressively feeding and machining apparatus 10A according to the first modification differs from the die 20 of the progressively feeding and machining apparatus 10. Specifically, as shown in FIG. 20, the die 20 has holes 69a defined therein at respective positions corresponding to larger holes 80b to be formed in the green sheet 16, the holes 69a having a diameter which is substantially the same as the diameter of the larger holes 80b, and, as shown in FIG. 21, the die 20 also has cylindrical recesses 88 defined therein at respective positions corresponding to smaller holes 80a to be formed in the green sheet 16, the recesses 88 being open into the suction chamber 26, and holes 69b defined centrally in the respective bottoms of the recesses 88 and extending to the upper surface of the die 20.

The cylindrical recesses 88 have a diameter slightly larger than the diameter of the holes 69b. Specifically, the diameter of the cylindrical recesses 88 is equal to the sum of the diameter of the holes 69b and 0.4 mm in order to keep a sufficient wall thickness between the cylindrical recesses 88 and the holes 69a for better die strength and machining accuracy. If the diameter of the cylindrical recesses 88 were too large, then the mechanical strength of the die 20 would undesirably be lowered. The holes 69*b* have a diameter which is substantially the same as the diameter of the smaller holes 80*b* to be formed in the green sheet 16. The cylindrical recesses 88 have a height "H" which is determined such that the bottoms of the recesses 88, whose thickness is equal to the difference between the thickness "L3" of the machining pattern 18 and the height "H", are strong enough to withstand forces applied from the green sheet 16 when it is pierced by the tip end portions 86 of the punches 22B. For example, the thickness (L3-H) is of 1.5 mm if the diameter of the tip end portion 86 of the punches 22B is of 0.214 mm, and the thickness (L3-H) is of 0.2 mm if the diameter of the tip end portion 86 of the punches 22B is of 0.05 mm.

When the first and second upper punch bases 14A, 14B are simultaneously lowered toward the die 20, the punches 22A on the first upper punch base 14A contact the green sheet 16 and pierce the green sheet 16. After the tip ends of the punches 22A have punched the green sheet 16, the punches 22B on the second upper punch base 14B contact the green sheet 16. Therefore, the punches 22A on the first upper punch base 14A contact the green sheet 16 earlier than the punches 22B on the second upper punch base 14B.

As a result, the thickness of the die 20 through which the punches 22A on the first upper punch base 14A are inserted, i.e., the thickness L3 of the machining pattern 18, may be increased to make the rigidity of the die 20 sufficiently large. Since the length "Lb" of the tip end portions 86 of the punches 22B, which serve to pierce the green sheet 16, may be reduced, the rigidity of the punches 22B may also be sufficiently large.

A progressively feeding and machining apparatus 10B according to a second modification of the present invention will be described below with reference to FIGS. 14A and 14B.

Figures 14A, 14B:
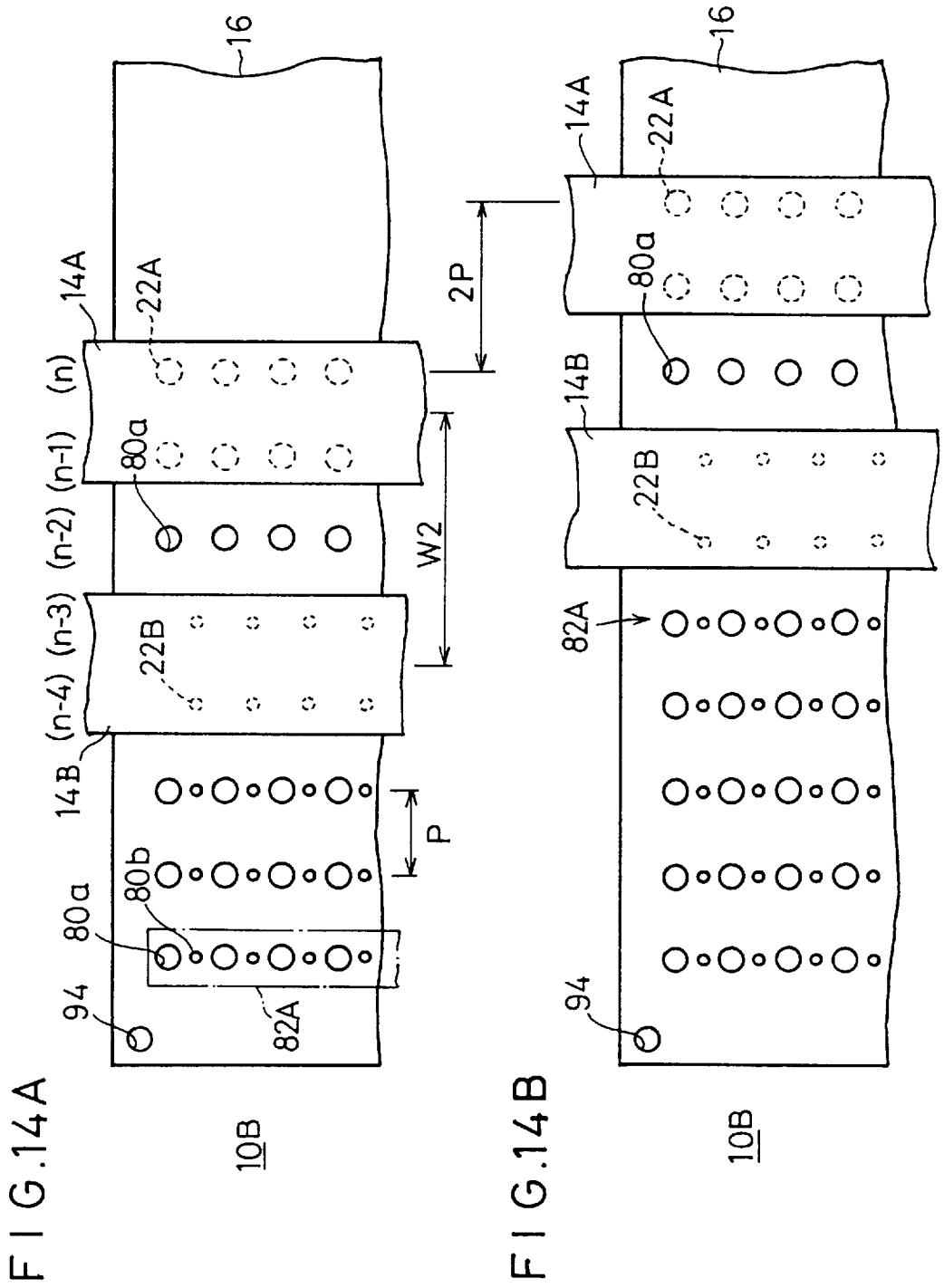
FIG. 14A is a schematic fragmentary plan view of a progressively feeding and machining apparatus according to a second modification of the present invention.
FIG. 14B is a view similar to FIG. 14A, showing first and second upper punch bases with respect to which a die has been moved by twice a pitch between adjacent rows of holes punched in a green sheet.

The progressively feeding and machining apparatus 10B according to the second modification is essentially similar in structure to the progressively feeding and machining apparatus 10A according to the first modification, but differs therefrom in that, as shown in FIGS. 14A and 14B, the first upper punch base 14A supports two arrays of punches 22A having a larger diameter and the second upper punch base 14B supports two arrays of punches 22B having a smaller diameter. The first and second upper punch bases 14A, 14B have respective axes spaced from each other by a distance "W2" which is equal to "3P" or "2P", for example, where "P" represents the pitch between adjacent rows of holes of the first machining pattern 82A.

When the first and second upper punch bases 14A, 14B are vertically moved in one cycle, the punches 22A on the first upper punch base 14A form two arrays of larger holes 80*a* in the green sheet 16 in nth and (n-1)th rows of the first machining pattern 82A, and the punches 22B on the second upper punch base 14B form two arrays of smaller holes 80*b* in the green sheet 16 in (n-3)th and (n-4)th rows of the first machining pattern 82A.

In each unit machining period "T", the first and second upper punch bases 14A, 14B are vertically moved with respect to the die 20 to punch holes 80*a*, 80*b* in the green sheet 16, and the die 20 is fed twice the pitch "P" with respect to the first. and second upper punch bases 14A, 14B, as shown in FIG. 14B, for thereby successively punching two rows of holes 80*a*, 80*b* in the green sheet 16 according to the first machining pattern 82A.

A progressively feeding and machining apparatus 10C according to a third modification of the present invention will be described below with reference to FIG. 15.

The progressively feeding and machining apparatus 10C according to the third modification is essentially similar in structure to the progressively feeding and machining apparatus 10, but differs therefrom in that, as shown in FIG. 15, the upper punch base 14 supports an array of alternate punches 22A, 22B of larger and smaller diameters according to the first machining pattern 82A.

When the upper punch base 14 is vertically moved in one cycle, the punches 22A, 22B on the upper punch base 14 form an array of alternate larger and smaller holes 80*a*, 80*b* in the green sheet 16 in an nth row of the first machining pattern 82A. In each unit machining period "T", the upper punch base 14 is vertically moved with respect to the die 20 to punch a row of alternate holes 80*a*, 80*b* in the green sheet 16, and the die 20 is fed the pitch "P" with respect to the upper punch base 14, as shown in FIG. 15, for thereby successively punching rows of holes 80*a*, 80*b* in the green sheet 16 according to the first machining pattern 82A.

Figure 22:
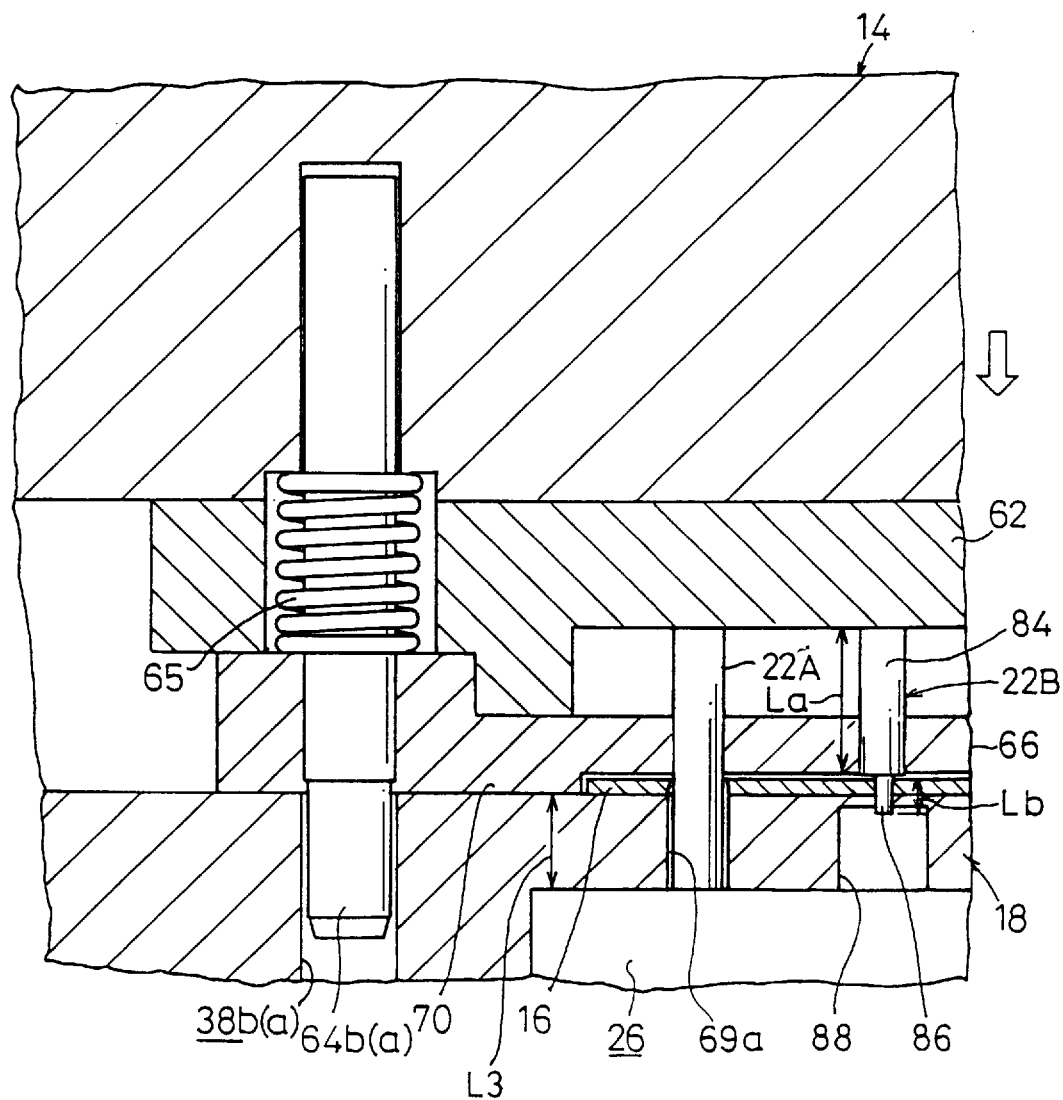
FIG. 22 is an enlarged fragmentary transverse vertical cross-sectional view of each of the progressively feeding and machining apparatus according to the third, fourth, and seventh sixth modifications, showing the upper punch base.
Figure 23:
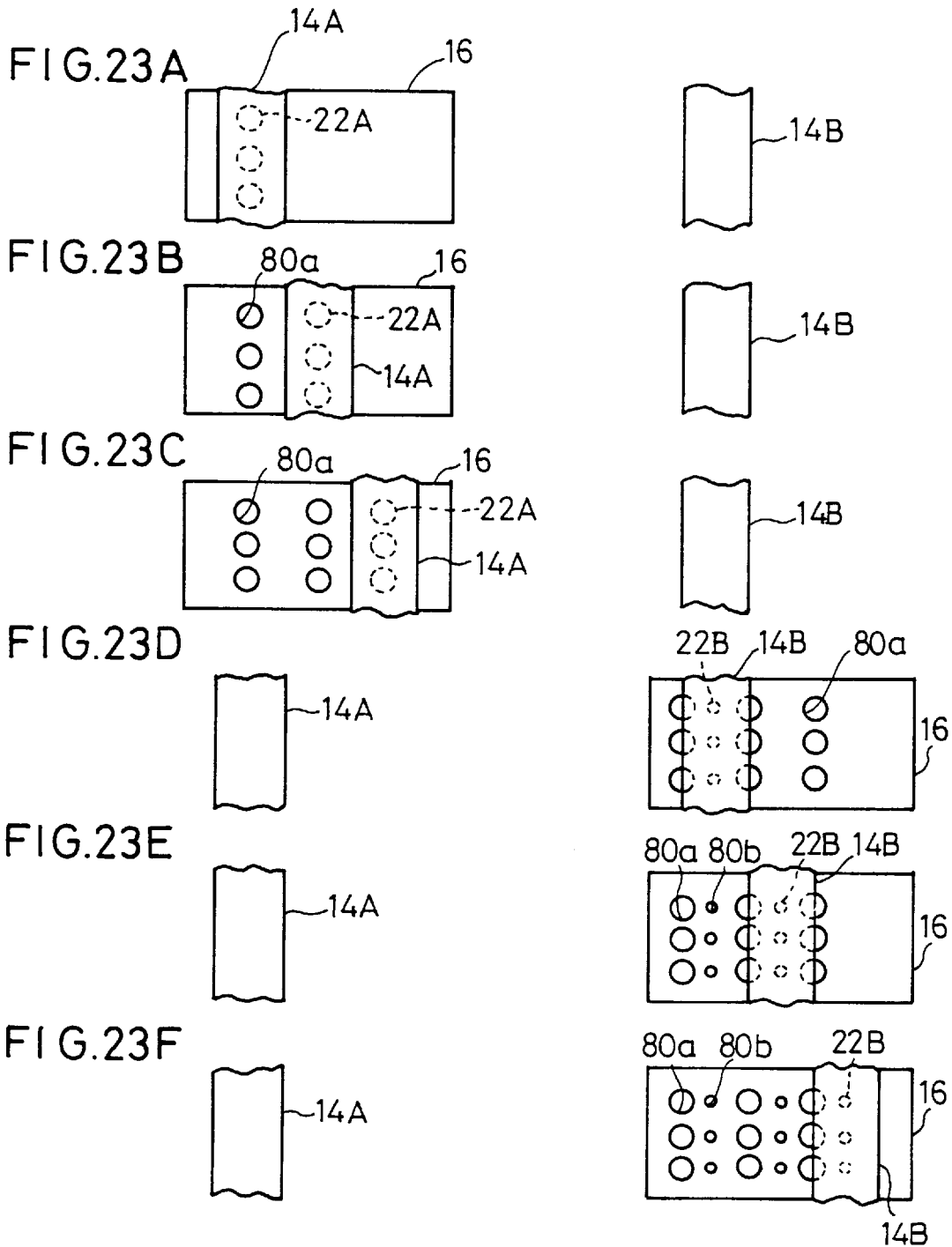
FIGS. 23A through 23F are schematic fragmentary plan views of a progressively feeding and machining apparatus according to an eighth modification of the present invention, FIGS. 23A through 23C showing the manner in which a die is moved downstream with respect to a first upper punch base for punching larger holes in a green sheet on the die, and FIGS. 23D through 23F showing the manner in which the die is moved downstream with respect to a second upper punch base for punching smaller holes in the green sheet on the die.

As shown in FIG. 22, the upper punch base 14 is essentially identical in structure to the upper punch base 14 of the progressively feeding and machining apparatus 10. However, the punches 22A have such a length that when the tip ends of the punches 22A reach their lowermost position, the tip ends project from the holes 69*a* slightly into the suction chamber 26. The punches 22B have a length smaller than the length of the punches 22A. Each of the punches 22B has a proximal portion 84 extending from the punch holder 62 over a length "La" and a tip end portion 86 extending from the proximal portion 84 over a length "Lb". The proximal portion 84 has a diameter which is substantially the same as the diameter of the punches 22A. The tip end portion 86, which serves to punch a hole in the green sheet 16, has a diameter which is substantially the same as the diameter of smaller holes 80*b* to be punched in the green sheet 16. The length "Lb" of the tip end portion 86 is equal to the sum of a distance of 0.1 mm by which it projects from the die 20, the thickness of the die 20, the thickness "d" of the green sheet 16, and an auxiliary clearance of 0.1 mm by which the green sheet 16 is spaced from the stripper 66. Accordingly, the upper punch holder 14 of the progressively feeding and machining apparatus 10C according to the third modification has a structure which is a combination of the first and second upper punch bases 14A, 14B of the progressively feeding and machining apparatus 10A according to the first modification.

The die 20 of the progressively feeding and machining apparatus 10C according to the third modification is identical in structure to the die 20 of the progressively feeding and machining apparatus 10A according to the first modification.

When the upper punch base 14 is lowered toward the die 20, the punches 22A contact the green sheet 16 and pierce the green sheet 16. After the tip ends of the punches 22A have punched the green sheet 16, the punches 22B contact the green sheet 16. Therefore, the punches 22A contact the green sheet 16 earlier than the punches 22B.

As a result, the thickness of the die 20 through which the punches 22A are inserted, i.e., the thickness L3 of the machining pattern 18, may be increased to make the rigidity of the die 20 sufficiently large. Since the length "Lb" of the tip end portions 86 of the punches 22B, which serve to pierce the green sheet 16, may be reduced, the rigidity of the punches 22B may also be sufficiently large.

A progressively feeding and machining apparatus 10D according to a fourth modification of the present invention will be described below with reference to FIG. 16.

The progressively feeding and machining apparatus 10D according to the fourth modification is essentially similar in structure to the progressively feeding and machining apparatus 10C according to the third modification, but differs therefrom in that, as shown in FIG. 16, the upper punch base 14 supports two arrays of alternate punches 22A, 22B of larger and smaller diameters.

When the upper punch base 14 is vertically moved in one cycle, the punches 22A, 22B form two rows of alternate larger and smaller holes 80a, 80b in the green sheet 16 in nth and (n-1)th rows of the first machining pattern 82A. In each unit machining period "T", the upper punch base 14 is vertically moved with respect to the die 20 to punch holes 80a, 80b in the green sheet 16, and the die 20 is fed twice the pitch "P" with respect to the upper punch base 14, for thereby successively punching holes 80a, 80b in the green sheet 16 according to the machining pattern 82A.

A progressively feeding and machining apparatus 10E according to a fifth modification of the present invention will be described below with reference to FIGS. 17A and 17B.

Figure 17A:
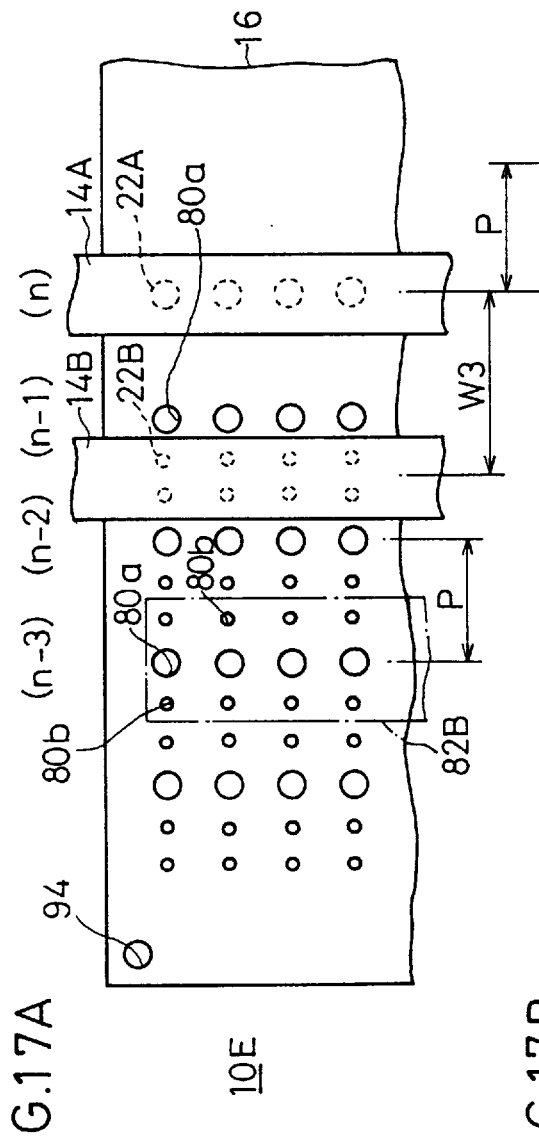
FIG. 17A is a schematic fragmentary plan view of a progressively feeding and machining apparatus according to a fifth modification of the present invention.
Figure 17B:
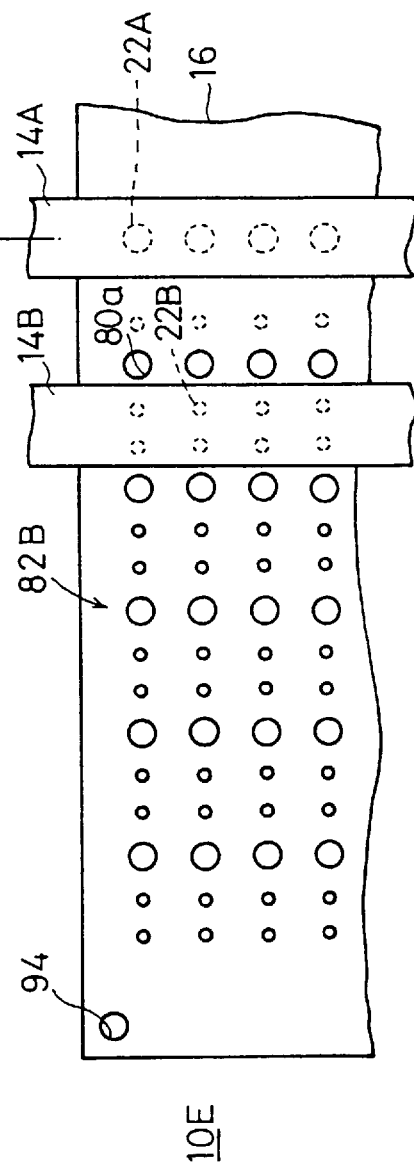
FIG. 17B is a view similar to FIG. 17A, showing first and second upper punch bases with respect to which a die has been moved by a pitch between adjacent rows of holes punched in a green sheet.

The progressively feeding and machining apparatus 10E according to the fifth modification is essentially the same as the progressively feeding and machining apparatus 10A according to the first modification, but differs therefrom in that, as shown in FIG. 17A, the second upper punch base 14B supports two arrays of punches 22B of a smaller diameter. The first and second upper punch bases 14A, 14B have respective axes spaced from each other by a distance "W3" which is equal to "1.5P" or "0.5P", for example, where "P" represents the pitch between adjacent arrays of holes of the second machining pattern 82B.

When the first and second upper punch bases 14A, 14B are vertically moved in one cycle, the punches 22A on the first upper punch base 14A form an array of larger holes 80a in the green sheet 16 in an nth row of the second machining pattern 82B, and the punches 22B on the second upper punch base 14B form two arrays of smaller holes 80b in the green sheet 16 between arrays of larger holes 80a in (n-1)th and (n-2)th rows of the second machining pattern 82B. At this stage, the green sheet 16 is punched up to the (n-2)th row of the second machining pattern 82B.

In each unit machining period "T", the first and second upper punch bases 14A, 14B are vertically moved with respect to the die 20 to punch holes 80a, 80b in the green sheet 16, and the die 20 is fed the pitch "P" with respect to the upper punch base 14, for thereby successively punching holes 80a, 80b in the green sheet 16 according to the machining pattern 82B.

A progressively feeding and machining apparatus 10F according to a sixth modification of the present invention will be described below with reference to FIGS. 18A and 18B.

The progressively feeding and machining apparatus 10F according to the sixth modification is essentially similar in structure to the progressively feeding and machining apparatus 10E according to the fifth modification, but differs therefrom in that, as shown in FIGS. 18A and 18B, the first upper punch base 14A supports a spaced pair of arrays of punches 22A of a larger diameter and the second upper punch base 14B supports a spaced pair of two arrays of punches 22B of a smaller diameter. The first and second upper punch bases 14A, 14B have respective axes spaced from each other by a distance "W4" which is equal to "2.5P" or "1.5P", for example, where "P" represents the pitch between adjacent arrays of holes of the second machining pattern 82B.

When the first and second upper punch bases 14A, 14B are vertically moved in one cycle, the punches 22A on the first upper punch base 14A form a spaced pair of arrays of larger holes 80a in the green sheet 16 in nth and (n-1)th rows of the second machining pattern 82B, and the punches 22B on the second upper punch base 14B form a spaced pair of two arrays of smaller holes 80b in the green sheet 16 between arrays of larger holes 80a in (n-2)th, (n-3)th, and (n-4)th rows of the second machining pattern 82B.

In each unit machining period "T", the first and second upper punch bases 14A, 14B are vertically moved with respect to the die 20 to punch holes 80a, 80b in the green sheet 16, and, as shown in FIG. 18B, the die 20 is fed twice the pitch "P" with respect to the upper punch base 14, for thereby successively punching holes 80a, 80b in the green sheet 16 according to the machining pattern 82B.

A progressively feeding and machining apparatus 10G according to a seventh modification of the present invention will be described below with reference to FIGS. 19A and 19B.

The progressively feeding and machining apparatus 10G according to the seventh modification is essentially similar in structure to the progressively feeding and machining apparatus 10D according to the fourth modification, but differs therefrom in that, as shown in FIGS. 19A and 189, the upper punch base 14 supports an array of punches 22A of a larger diameter and two arrays of punches 22B of a smaller diameter, one on each side of the array of punches 22A.

When the upper punch base 14 is vertically moved in one cycle, the punches 22A form an array of larger holes 80a in the green sheet 16 in an nth row of the second machining pattern 82B, and the punches 22B form two arrays of smaller holes 80b in the green sheet 16, one on each side of the array of larger holes 80a.

In each unit machining period "T", the upper punch base 14 is are vertically moved with respect to the die 20 to punch holes 80a, 80b in the green sheet 16, and, as shown in FIG. 19B, the die 20 is fed twice the pitch "P" with respect to the upper punch base 14, for thereby successively punching holes 80a, 80b in the green sheet 16 according to the machining pattern 82B.

A progressively feeding and machining apparatus according to an eighth modification of the present invention will be described below with reference to FIGS. 23A through 23F.

The progressively feeding and machining apparatus according to the eighth modification is essentially the same as the progressively feeding and machining apparatus according to the first modification, but differs therefrom in that, as shown in FIGS. 23A through 23F, the first upper punch base 14A which has an array of punches 22A for punching larger holes 80a in the green sheet 16 and the second upper punch base 14B which has an array of punches 22B for punching smaller holes 80b in the green sheet 16 are spaced from each other by a distance that corresponds the length of the green sheet 16.

FIGS. 23A through 23C show the manner in which the die is moved downstream with respect to the first upper punch base 14A for punching larger holes 80a in the green sheet 16 on the die, and FIGS. 23D through 23F show the manner in which the die is moved downstream with respect to the second upper punch base 14B for punching smaller holes 80b in the green sheet 16 on the die;

Specifically, first, as shown in FIGS. 23A through 23C, only the first upper punch base 14A is vertically moved to punch arrays of larger holes 80a in the green sheet 16 while the green sheet 16 on the die is successively fed downstream with respect to the first upper punch base 14A. Then, as shown in FIGS. 23D through 23F, the green sheet 16 is delivered to a position below the second upper punch base 14B, and only the second upper punch base 14B is vertically moved to punch arrays of smaller holes 80b in the green sheet 16, between the arrays of larger holes 80a while the green sheet 16 on the die is successively fed downstream with respect to the second upper punch base 14B. As a result, the green sheet 16 is punched according to a first pattern of arrays of larger holes 80a and a second pattern of arrays of smaller holes 80b which alternate with the arrays of larger holes 80a.

A sequence control system for operating the progressively feeding and machining apparatus according to the eighth modification is highly simple because the first and second upper punch bases 14A, 14B are individually actuated.

A progressively feeding and machining apparatus according to a ninth modification of the present invention will be described below. In the progressively feeding and machining apparatus according to the ninth modification, the first and second upper punch bases 14A, 14B of the progressively feeding and machining apparatus according to the eighth modification are arranged in an array transverse to the green sheet 16, and the die 20 is actuated biaxially in two directions by an X-Y table, for example.

In the ninth modification, only the first upper punch base 14A is vertically moved to punch arrays of larger holes 80a in the green sheet 16. After the arrays of larger holes 80a are punched in the green sheet 16, the die 20 has been spaced downstream from the first upper punch base 14A. Thereafter, the die 20 is laterally moved by the X-Y table into a position in a path of movement of the second upper punch base 14B. When the die 20 is positioned in the path of movement of the second upper punch base 14B, the die 20 is then delivered to a position below the second upper punch base 14B. The second upper punch base 14B is vertically moved to punch arrays of smaller holes 80b in the green sheet 16. As a consequence, as with the eighth modification, the green sheet 16 is punched according to a first pattern of arrays of larger holes 80a and a second pattern of arrays of smaller holes 80b which alternate with the arrays of larger holes 80a.

The progressively feeding and machining apparatus according to the ninth modification is relatively complex in structure because of the X-Y table. However, as with the eighth modification, a sequence control system for operating the progressively feeding and machining apparatus according to the ninth modification is highly simple because the first and second upper punch bases 14A, 14B are individually actuated.

As described above, the progressively feeding and machining apparatus 10A, 10B, 10E, 10F according to the first, second, fifth, and sixth modifications have the first and second upper punch bases 14A, 14B which support respective punches 22A, 22B of different diameters. Therefore, the first and second upper punch bases 14A, 14B can simultaneously punch the green sheet 16 in each unit machining period "T", hence can punch the green sheet 16 within a shorter period of time. Since the progressively feeding and machining apparatus 10A, 10B, 10E, 10F can punch holes in the green sheet 16 according to differently sized patterns, they can punch the green sheet 16 according to various patterns.

The progressively feeding and machining apparatus 10C, 10D, 10G according to the third, fourth, and seventh modifications have the single upper punch base 14 which supports punches 22A, 22B of different diameters. Therefore, the single upper punch base 14 can function in the same manner as the first and second upper punch bases 14A, 14B, allowing the progressively feeding and machining apparatus 10C, 10D, 10G to be reduced in size.

In the progressively feeding and machining apparatus according to the first through ninth modifications, the punches 22 (including the punches 22A, 22B) on the upper punch base 14 (including the first and second punch bases 14A, 14B) may be integrally formed with each other.

FIG. 24 shows a punch block 90 having an integral array of punches 22 which can be supported on the upper punch base 14 of the progressively feeding and machining apparatus 10.

Generally, the punches 22 are manufactured by a grinding process. The grinding process is advantageous over an electrical-discharge wire cutting process in that (1) a modified layer produced by the grinding process is small, (2) any surface roughness caused by the grinding process is small, (3) the punches 22 can be machined quickly by the grinding process, and (4) the grinding process has technically proven satisfactory.

If an assembly of punches is of such a shape that cannot be manufactured as a unitary structure by the grinding process, e.g., if round punches are arrayed at an equal pitch or punches are spaced at an interval smaller than the width of an existing grinding wheel, then the punches have to be individually produced and combined with each other.

Since the punches 22 are very small in size, they are required to have a desired level of mechanical strength and wear resistance. To meet such requirements, the punches should be made of an ultra-fine-particle cemented carbide material which has a desired degree of both hardness and toughness. A metal material which has the highest hardness is cemented carbide, which is however low in toughness and tends to crack under shocks. When the ultra-fine-particle cemented carbide material is processed by electrical-discharge wire cutting, it is liable to crack due to thermal shocks and cannot be processed into punches.

The punch block 90 with integral punches 22 offers the following advantages:

The integral structure of the punches 22 can reduce the pitch "P" of the punches. Therefore, the punched holes in the green sheet 16 are spaced at a reduced pitch because they have dimensions transferred from the dimensions of the punches 22. The fine and accurate pattern of the punches 22 is effective to prevent localized loads from being applied to the stripper 66 which is also machined according to a fine pattern to position the punches 22. Therefore, the stripper 66 is made resistant to undue damage which would otherwise be caused by the punches 22.

The integral structure of the punches 22 also serves to increase the rigidity of the punches 22 against unwanted breakage or inclination.

As shown in FIG. 25, when the green sheet 16 is punched by the punches 22, it has a plurality of beams 92 left between the holes punched out of the green sheet 16, and those beams 92 would tend to be broken or inclined under forces applied by the punches 22. Since the green sheet 16 is subjected to uniform forces when it is punched by the punches 22 of the integral structure, those beams 92 are prevented from being broken or inclined.

If the punches 22 were individually manufactured and assembled with the small pitch "P", then a process of servicing those punches 22 which are broken and a process of assembling the punches 22 would be highly complex and time-consuming. On the other hand, the integral structure of the punches 22 allows the punches 22 to be serviced and assembled easily and quickly in a reduced number of steps.

Inasmuch as the green sheet 16 is soft, the punches 22 are not required to have a particularly high level of toughness. Therefore, even if the punches 22 are made of a general cemented carbide material by electrical-discharge wire cutting, the punches 22 can punch the green sheet 16 with sufficient accuracy.

The progressively feeding and machining apparatus 10, 10A~10G according to the embodiment and first through seventh modifications are illustrated as being used to punch the green sheet 16. However, they may be used to punch any sheet materials whose Young's modulus is 25 kgf/mm$^2$ or less.

The inner wall surfaces of the holes 69 (including the holes 69a, 69b) in the die 20 should preferably have a surface roughness whose maximum height Rmax is of 1 $\mu$m or less. With such a surface roughness, since scraps punched out suffer reduced frictional forces upon contact with the inner wall surfaces of the holes 69, the scraps can smoothly be discharged from the holes 69 into the suction chamber 26 under vacuum.

A sheet material positioning means for positioning the green sheet 16 may be mounted on the die 20. Specifically, the sheet material positioning means may comprise a plurality of positioning holes 94 (one shown in FIG. 13A, for example) defined in corners of the green sheet 16, and a plurality of positioning pins mounted on the die 20 for insertion into the positioning holes 94.

When the green sheet 16 is placed on the die 20, t he positioning pins on the die 20 are inserted respectively into the positioning holes 94 in the green sheet 16 for thereby positioning the green sheet 16 on the die 20. Therefore, the green sheet 16 can subsequently be punched with high dimensional accuracy by the punches 22.

Figure 26:
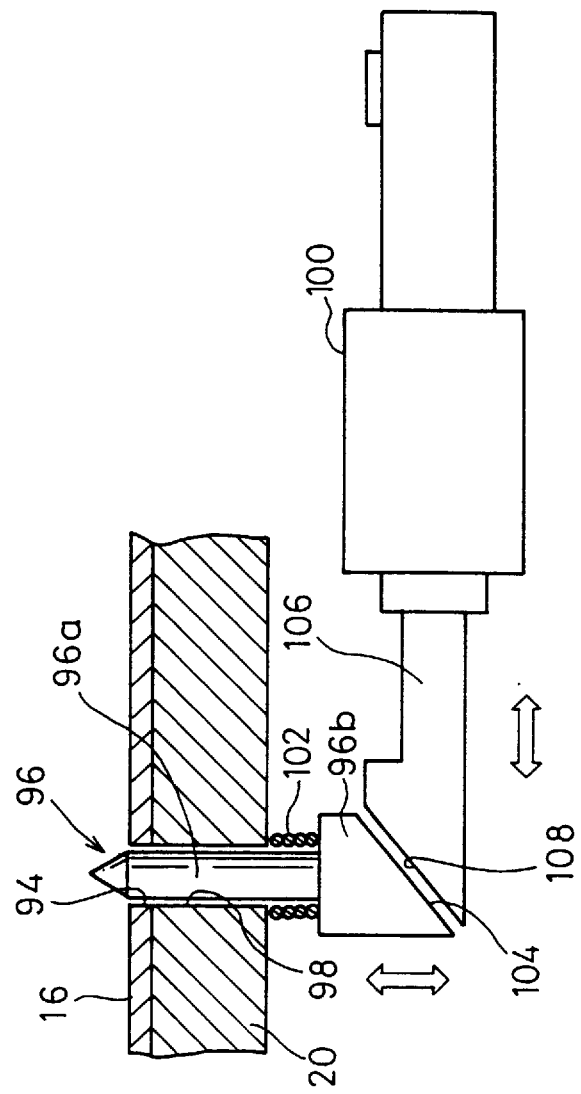
FIG. 26 is a fragmentary side elevational view, partly in cross section, of a sheet material positioning means for positioning the green sheet on the die.
Figure 27:
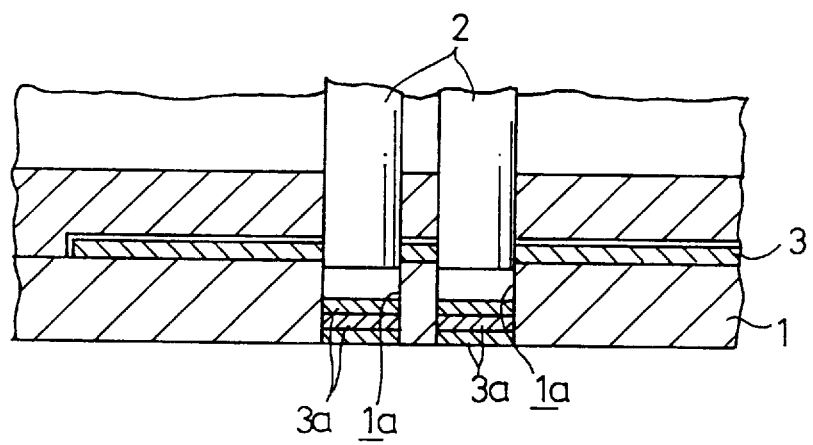
FIG. 27 is a fragmentary vertical cross-sectional view showing a conventional punching process.

FIG. 26 shows another sheet material positioning means for positioning the green sheet 16 on the die 20. As shown in FIG. 26, the sheet material positioning means has a positioning pin 96 which is movable into and out of a positioning hole 94 defined in the green sheet 16 placed on the die 20. The die 20 has a vertical through hole 98 defined in the die 20 for insertion therein of the positioning pin 96. The sheet material positioning means also has an air cylinder 100 for moving the positioning pin 96 into and out of the positioning hole 94 defined in the green sheet 16 through the through hole 98 in the die 20.

The positioning pin 96 comprises a shank 96a whose diameter is slightly smaller than the diameter of the through hole 98, and a pin shifter 96b integrally formed with the lower end of the shank 96a and having a cross-sectional area larger than that of the shank 96a. A helical compression spring 102 acts between the lower surface of the die 20 and the upper surface of the pin shifter 96b for normally urging the positioning pin 96 to an initial state in which the tip end of the shank 96a is retracted into the through hole 98, for example.

The pin shifter 96b has a tapered lower end surface 104, and a piston rod 106 reciprocally movable by an air cylinder 100 has a tapered end surface 108. These tapered end surfaces 104, 108 are brought into and out of contact with each other by the air cylinder 100 to move the positioning pin 96 into and out of the positioning hole 94.

When the green sheet 16 is placed on the die 20, the air cylinder 100 is actuated to project the piston rod 106 toward the positioning pin 96 thereby to engage and move upwardly the pin shifter 96b, which pushes the shank 96a upwardly against the bias of the helical compression spring 102 until the tip end thereof projects above the upper surface of the die 20. The shank 96a of the positioning pin 96 is now inserted into the positioning hole 94 in the green sheet 16 for thereby positioning the green sheet 16 in place on the die 20.

For removing the green sheet 16 from the die 20 after the green sheet 16 has completely been punched, the air cylinder 100 is operated to retract the piston rod 106 out of engagement with the pin shifter 96b. Since the shank 96b of the positioning pin 96 is pushed downwardly under the bias of the helical compression spring 102, the positioning pin 96 is retracted downwardly out of the positioning hole 94. Usually, when the green sheet 16 with the positioning pin 96 inserted in the positioning hole 94 is to be removed from the die 20, a peripheral edge of the green sheet 16 is manually gripped and lifted off the die 20. At the time, the green sheet 16 is manually pulled off the positioning pin 96, the green sheet 16 tends to suffer undue forces which are liable to reduce the dimensional accuracy thereof.

With the sheet material positioning means shown in FIG. 26, however, the positioning pin 96 is automatically retracted out of the positioning hole 94 before the green sheet 16 is removed from the die 20. Therefore, the positioning of the green sheet 16 on the die 20 is canceled prior to removal of the green sheet 16 from the die 20, so that undue forces will not be applied to the green sheet 16 when the green sheet 16 is manually taken off the die 20. Since a process of placing the green sheet 16 on the die 20 and a process of removing the green sheet 16 from the die 20 can be automatized, it is possible to fully automatize the entire process of punching the green sheet 16 on the die 20.

Although certain preferred embodiments of the present invention have been shown and described in detail, it should be understood that various changes and modifications may be made therein without departing from the scope of the appended claims.

What is claimed is:

1. An apparatus for progressively feeding and machining a sheet material, comprising:

a die for placing a sheet material thereon, said die having a machining pattern for machining the sheet material;

a machining head movable toward and away from said die and having a plurality of punches for machining the sheet material in coaction with said die in a predetermined number of machining cycles according to said machining pattern;

a feed mechanism for moving said die, with the sheet material placed thereon, and said punches relatively to each other to align a machining position on the sheet material with said punches each time the sheet material is machined by said die and said punches;

a suction chamber communicating with said machining pattern; and closure means for isolating a machined region of the machining pattern from said suction chamber to maintain said suction chamber under a vacuum when said suction chamber is evacuated;

said closure means comprising at least one partition wall extending across said die in a direction substantially transverse to a direction of movement of said die, said partition wall being in sliding contact with an underside of said die.

2. An apparatus according to claim 1, wherein said closure means comprises means for isolating a portion of the suction chamber which corresponds to a region of the machining pattern to be immediately machined, from said suction chamber to maintain said region under said vacuum.

3. An apparatus according to claim 1, wherein said machining head comprises a plurality of machining heads having respective sets of punches of different cross-sectional areas.

4. An apparatus according to claim 3, wherein said punches have respective lengths such that the tip ends thereof contact said sheet material at different times depending on said different cross-sectional areas.

5. An apparatus according to claim 4, wherein said punches have respective lengths such that the tip ends of the punches of a smaller cross-sectional area contact said sheet material later than said tip ends of the punches of a larger cross-sectional area.

6. An apparatus according to claim 1, wherein said machining head comprises a single machining head having respective sets of punches of different cross-sectional areas.

7. An apparatus according to claim 6, wherein said punches have respective lengths such that the tip ends thereof contact said sheet material at different times depending on said different cross-sectional areas.

8. An apparatus according to claim 7, wherein said punches have respective lengths such that the tip ends of the punches of a smaller cross-sectional area contact said sheet material later than said tip ends of the punches of a larger cross-sectional area.

9. An apparatus according to claim 1, wherein said punches are of a unitary integral structure.

10. An apparatus according to claim 1, further comprising means for evacuating said suction chamber before said sheet material is machined by said punches in coaction with said die.

11. An apparatus according to claim 1, further comprising means for evacuating said suction chamber before said sheet material is machined by said punches in coaction with said die, said suction chamber being evacuated continuously if each machining period in which to machine the sheet material with said die and said punches is smaller than a predetermined time, and intermittently if each machining period is equal to or greater than said predetermined time.

12. An apparatus according to claim 1, further comprising a base, wherein said die is movably mounted on said base for movement a predetermined distance on said base with said feed mechanism, said closure means being mounted in said base and having a partition which cooperates with an inner wall surface of said die in defining said suction chamber.

13. An apparatus according to claim 1, further comprising a base, wherein said die is movably mounted on said base for movement a predetermined distance on said base with said feed mechanism, said closure means being mounted in said base and having a partition which cooperates with an inner wall surface of said die in defining said suction chamber, and further comprising positioning means for positioning said die with respect to said machining head.

14. An apparatus according to claim 1, further comprising:
   a stripper for holding said sheet material on said die when said punches are separated from the sheet material; and
   a shim for keeping said stripper from unduly pressing said sheet material when said stripper is held against said sheet material.

15. An apparatus according to claim 14, further comprising means for stopping said punches against movement toward said die for a predetermined period of time when tip ends of said punches are positioned above an upper surface of said sheet material and near a lower surface of said stripper.

16. An apparatus according to claim 15, wherein said lower surface of said stripper is spaced from the upper surface of said sheet material by a gap having a predetermined thickness at least while said punches are stopped against movement toward said die for said predetermined period of time.

17. An apparatus according to claim 1, further comprising:
   sheet material positioning means for positioning said sheet material in place on said die.

18. An apparatus according to claim 17, wherein said sheet material positioning means comprises a plurality of positioning holes defined in said sheet material, and a plurality of positioning pins mounted on said die for insertion into said positioning holes, respectively.

19. An apparatus according to claim 18, wherein said positioning pins are movable into and out of said positioning holes defined in said sheet material which is placed on said die.

20. An apparatus according to claim 1, wherein said sheet material has a Young's modulus of at most 25 kgf/mm$^2$.

21. An apparatus according to claim 1, wherein said die has inner wall surfaces for coaction with said punches, each of said inner wall surfaces having a surface roughness whose maximum height (Rmax) is at most 1 $\mu$m.

* * * * *